US012757637B2

(12) United States Patent
Ohashi et al.

(10) Patent No.: US 12,757,637 B2
(45) Date of Patent: Oct. 6, 2026

(54) PIEZOELECTRIC ELEMENT

(71) Applicant: SEIKO EPSON CORPORATION, Tokyo (JP)

(72) Inventors: Koji Ohashi, Matsumoto (JP); Yasuaki Hamada, Chino (JP); Kazuya Kitada, Matsumoto (JP); Yoshiki Yano, Chino (JP); Tsutomu Asakawa, Shiojiri (JP); Masahiro Takeuchi, Chino (JP); Yasuhiro Horiba, Shiojiri (JP); Yasuhiro Itayama, Kai (JP)

(73) Assignee: Seiko Epson Corporation, Tokyo (JP)

( * ) Notice: Subject to any disclaimer, the term of this patent is extended or adjusted under 35 U.S.C. 154(b) by 778 days.

(21) Appl. No.: 18/121,624

(22) Filed: Mar. 15, 2023

(65) Prior Publication Data

US 2023/0301192 A1 Sep. 21, 2023

(30) Foreign Application Priority Data

Mar. 17, 2022 (JP) ................................ 2022-042273
Mar. 17, 2022 (JP) ................................ 2022-042274

(51) Int. Cl.

*H10N 30/85* (2023.01)
*B41J 2/14* (2006.01)
*H10N 30/00* (2023.01)
*H10N 30/20* (2023.01)

(52) U.S. Cl.

CPC .......... *H10N 30/85* (2023.02); *B41J 2/14233* (2013.01); *H10N 30/2047* (2023.02); *H10N 30/704* (2024.05)

(58) Field of Classification Search

CPC ............. H10N 30/8542; H10N 30/708; H10N 30/079; H10N 30/078; H10N 30/704; H10N 30/85; H10N 30/2047; B41J 2002/14491; B41J 2002/14362; B41J 2/4233

See application file for complete search history.

(56) References Cited

U.S. PATENT DOCUMENTS

2008/0252697 A1 10/2008 Kamei
2010/0020135 A1* 1/2010 Morozumi ........... H10N 30/877 347/71
2015/0231884 A1* 8/2015 Kobayashi ............. B41J 2/1632 29/25.35
2015/0280103 A1 10/2015 Kobayashi et al.
2016/0346808 A1 12/2016 Miyazawa et al.
2018/0233656 A1 8/2018 Kitada et al.
2023/0371385 A1* 11/2023 Takeuchi ........... H10N 30/2047

FOREIGN PATENT DOCUMENTS

CN 101150168 A 3/2008
CN 104943385 A 9/2015
JP 2014-065317 A 4/2014
JP 2016-220892 A 12/2016
JP 2018-133458 A 8/2018
JP 2019133981 A * 8/2019

* cited by examiner

*Primary Examiner* — J. San Martin
(74) *Attorney, Agent, or Firm* — Spencer Fane LLP

(57) ABSTRACT

A piezoelectric element includes an adhesion layer formed at a vibration plate and containing titanium, a lower electrode formed at the adhesion layer, a diffusion reduction layer formed at the lower electrode and containing iridium, a seed layer formed at the diffusion reduction layer and containing bismuth, a piezoelectric layer formed at the seed layer and containing potassium, sodium, and niobium, and an upper electrode formed at the piezoelectric layer.

7 Claims, 15 Drawing Sheets

PIEZOELECTRIC ELEMENT

The present application is based on, and claims priority from JP Application Serial Number 2022-042274, filed Mar. 17, 2022 and, JP Application Serial Number 2022-042273, filed Mar. 17, 2022, the disclosure of which is hereby incorporated by reference herein in its entirety.

BACKGROUND

1. Technical Field

The present disclosure relates to a piezoelectric element.

2. Related Art

A piezoelectric element using a lead-free piezoelectric material instead of a lead-based piezoelectric material such as lead zirconate titanate has been developed in related art. For example, JP-A-2018-133458 discloses a piezoelectric element including a potassium sodium niobate (KNN)-based piezoelectric layer. In the piezoelectric element, an adhesion layer that improves adhesion between a first electrode and a vibration plate is formed between the first electrode and the vibration plate. Titanium, titanium oxide, or the like is used for the adhesion layer.

However, in the piezoelectric element disclosed in JP-A-2018-133458, when the piezoelectric layer is formed to be relatively thick, cracks are likely to occur in the piezoelectric layer. Specifically, KNN is a composite oxide having a perovskite structure. When titanium or titanium oxide is used for the adhesion layer, titanium is likely to diffuse into the piezoelectric layer due to a heat treatment or the like in a manufacturing process. When titanium diffuses, a growth of KNN crystal grains oriented to a (111) plane proceeds in addition to original KNN crystal grains preferentially oriented to a (100) plane. Therefore, when the piezoelectric layer is formed to be relatively thick, internal stress tends to concentrate on crystal grain boundaries due to a difference in shrinkage ratio, and cracks may occur in the piezoelectric layer.

When the adhesion layer is omitted or zirconium is used for the adhesion layer, cracks are likely to occur in the piezoelectric layer regardless of a crystal orientation. This is because, although the diffusion of titanium is reduced, residual stress inside the piezoelectric layer generated due to a difference in linear expansion coefficient and/or a difference in lattice spacing between the piezoelectric layer and the vibration plate is less likely to be relaxed. That is, there has been a demand for a piezoelectric element that prevents occurrence of cracks in a piezoelectric layer.

SUMMARY

Provided is a piezoelectric element including: an adhesion layer formed at a substrate and containing titanium; a lower electrode formed at the adhesion layer; a diffusion reduction layer formed at the lower electrode and containing iridium; a seed layer formed at the diffusion reduction layer and containing bismuth; a piezoelectric layer formed at the seed layer and containing potassium, sodium, and niobium; and an upper electrode formed at the piezoelectric layer.

DESCRIPTION OF EXEMPLARY EMBODIMENTS

1. First Embodiment

In an embodiment to be described below, a piezoelectric element using a lead-free piezoelectric material, a droplet ejection head applied with the piezoelectric element, and a recording apparatus will be exemplified and described with reference to the drawings. Each of the following drawings is attached with X, Y, and Z axes that are coordinate axes, with a direction indicated by an arrow as a + direction, and a direction opposite to the + direction as a − direction. A +Z direction may be referred to as upward and a −Z direction may be referred to as downward, and a view from the +Z direction may be referred to as a plan view. A size of each member is different from an actual size for convenience of illustration.

1.1. Recording Apparatus

Figure 1:
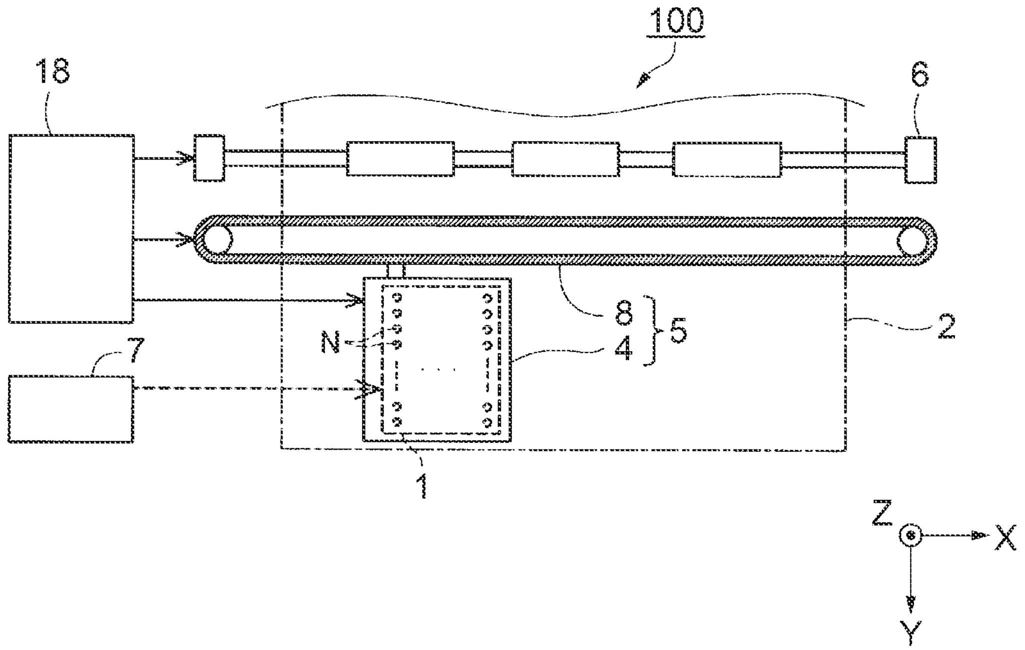
FIG. 1 is a schematic diagram showing a schematic configuration of a recording apparatus including a droplet ejection head according to a first embodiment.

As shown in FIG. 1, a recording apparatus 100, which is an inkjet printer, includes a droplet ejection head 1. The droplet ejection head 1 includes piezoelectric elements 44 according to the embodiment, which will be described later.

In the recording apparatus 100, printing such as recording is performed by attaching ink droplets from the droplet ejection head 1 to a recording medium 2. In addition to the droplet ejection head 1, the recording apparatus 100 includes a head movement mechanism 5, a medium conveyance mechanism 6, an ink accommodating unit 7, and a control unit 18.

The head movement mechanism 5 includes a carriage 4 and a timing belt 8. The droplet ejection head 1 is mounted on the carriage 4. The carriage 4 is coupled to the timing belt 8. The timing belt 8 moves the carriage 4 in a direction along the X axis, which is a main scanning direction, by driving a motor (not shown). Accordingly, the droplet ejection head 1 can reciprocate in the direction along the X axis relative to the recording medium 2.

The medium conveyance mechanism 6 conveys the recording medium 2 in a +Y direction, which is a sub-scanning direction. Accordingly, the recording medium 2 moves in the +Y direction relative to the droplet ejection head 1.

The ink accommodating unit 7 accommodates ink ejected from the droplet ejection head 1. The ink accommodated in the ink accommodating unit 7 is supplied to the droplet ejection head 1 via an ink pipe (not shown). A plurality of ink accommodating units 7 may be arranged corresponding to a plurality of types of ink exhibiting colors such as black, cyan, magenta, and yellow. Droplets ejected from the droplet ejection head 1 are not limited to ink, and may be droplets other than ink, such as treatment liquid and cleaning liquid.

The droplet ejection head 1 is disposed on a side of the carriage 4 facing the recording medium 2. The droplet ejection head 1 includes a nozzle surface (not shown) at a surface facing the recording medium 2. A plurality of nozzles N are formed in the nozzle surface. The plurality of nozzles N are formed in rows corresponding to the type of ink described above.

The ink in the ink accommodating unit 7 is supplied to the droplet ejection head 1, and is ejected as droplets from the plurality of nozzles N by an actuator (to be described later) of the droplet ejection head 1. The ejected ink droplets land on and adhere to the recording medium 2.

The control unit 18 includes a plurality of processing circuits such as a central processing unit (CPU) and a field programmable gate array (FPGA), and a storage circuit such as a semiconductor memory. The control unit 18 controls the overall operation of the recording apparatus 100. The head movement mechanism 5, the medium conveyance mechanism 6, the droplet ejection head 1, and the like are electrically coupled to the control unit 18, and are integrally controlled by the control unit 18.

As described above, an image or the like is printed on the recording medium 2 by causing the ink to adhere to the recording medium 2 at a predetermined timing in correspondence with movement of the droplet ejection head 1 in the main scanning direction and conveyance of the recording medium 2 in the sub-scanning direction.

In the embodiment, a serial printer is exemplified as the recording apparatus 100, but a recording apparatus applied with the droplet ejection head 1 is not limited thereto. For example, the recording apparatus may be a line head printer. An apparatus on which the droplet ejection head 1 is mounted is not limited to the recording apparatus 100, and may be, for example, an apparatus for manufacturing a color filter of a liquid crystal display or the like, an apparatus for forming an electrode of an organic electroluminescence display or a field emission display, or a biochip manufacturing apparatus.

1.2. Droplet Ejection Head

Figure 2:
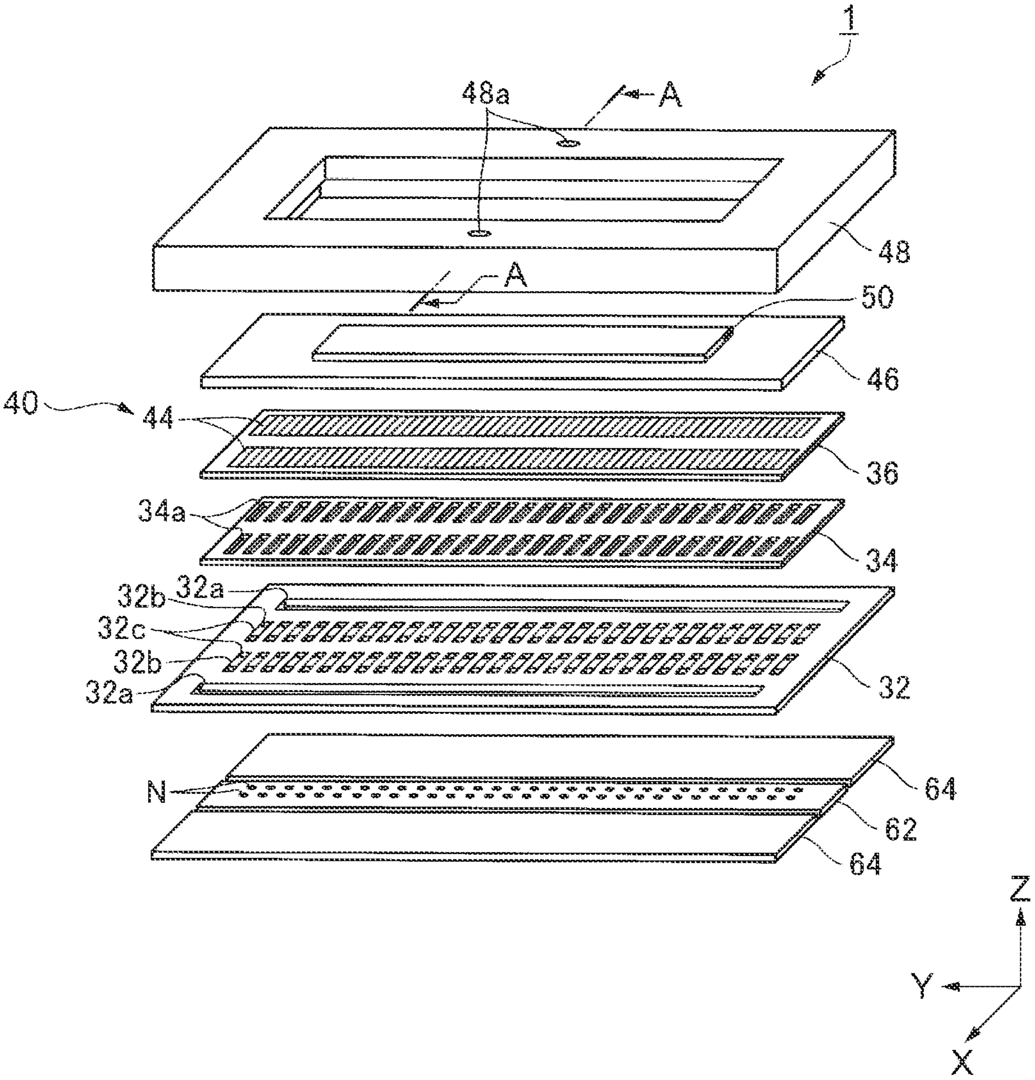
FIG. 2 is an exploded perspective view of the droplet ejection head.

As shown in FIG. 2, the droplet ejection head 1 includes a nozzle plate 62, two vibration absorbers 64, a flow path formation substrate 32, a pressure chamber substrate 34, a plurality of piezoelectric elements 44, a vibration plate 36 as a substrate, a wiring substrate 46, a drive circuit 50, and a housing portion 48. The plurality of piezoelectric elements 44 constitute a piezoelectric device 40.

The nozzle plate 62, the vibration absorbers 64, the flow path formation substrate 32, the pressure chamber substrate 34, the vibration plate 36, and the wiring substrate 46 are substantially rectangular plate-shaped members, and longitudinal directions thereof are aligned with the Y axis in the plan view. At the time of manufacturing the droplet ejection head 1, the nozzle plate 62, the two vibration absorbers 64, the flow path formation substrate 32, the pressure chamber substrate 34, the vibration plate 36, the wiring substrate 46, and the housing portion 48 are laminated in this order, and are bonded to each other by, for example, an adhesive.

The nozzle plate 62, the flow path formation substrate 32, the pressure chamber substrate 34, and the vibration plate 36 each have a substantially line-symmetrical structure with respect to a center line in a direction along the X axis. In the plan view, sizes of the pressure chamber substrate 34, the vibration plate 36, and the wiring substrate 46 are smaller than sizes of the flow path formation substrate 32 and the housing portion 48.

The plurality of nozzles N are formed in the nozzle plate 62. The nozzle N is a through hole bored in the nozzle plate 62, and has a substantially circular shape in the plan view. The plurality of nozzles N are arranged along the Y axis, and two rows are arranged in the direction along the X axis. The two vibration absorbers 64 are disposed with the nozzle plate 62 interposed therebetween in the direction along the X axis. The two vibration absorbers 64 are flexible films.

The flow path formation substrate 32 has two first openings **32*a*, a plurality of second openings 32*b*, and a plurality of third openings 32*c*. The first opening 32*a* has a substantially rectangular shape whose longitudinal direction is parallel to the Y axis in the plan view. The first opening 32*a* is formed along a long side of the flow path formation substrate 32** along the Y axis in the plan view.

The plurality of second openings **32*b* are arranged in a direction along the Y axis to form two rows. Similarly, the plurality of third openings 32*c* are also arranged in the direction along the Y axis to form two rows. In the direction along the X axis, one first opening 32*a*, one row of second openings 32*b*, one row of third openings 32*c*, one row of third openings 32*c*, one row of second openings 32*b*, and the other first opening 32*a* are arranged adjacently in this order. The second opening 32*b* and the third opening 32*c*** adjacent to each other in the direction along the X axis are disposed such that positions in the direction along the Y axis are substantially the same.

The pressure chamber substrate 34 has a plurality of openings **34*a*. The opening 34*a* has a substantially rectangular shape whose longitudinal direction is parallel to the X axis in the plan view. The plurality of openings 34*a* are arranged in the direction along the Y axis to form two rows. The two rows of the plurality of openings 34*a* are arranged adjacently in the direction along the X axis. Each of the openings 34*a* is formed at a position overlapping with the second opening portion 32*b* and the third opening portion 32*c* adjacent to each other in the flow path formation substrate 32** in the plan view.

The plurality of piezoelectric elements 44 are formed at the vibration plate 36. Specifically, the plurality of piezoelectric elements 44 are disposed at an upper main surface of the vibration plate 36. The plurality of piezoelectric elements 44 are respectively provided at positions overlapping the plurality of openings 34*a* in the pressure chamber substrate 34 in the plan view. Each opening 34*a* in the pressure chamber substrate 34 forms a pressure chamber C to be described later together with a lower surface of the vibration plate 36.

The drive circuit 50 drives the plurality of piezoelectric elements 44. Specifically, the drive circuit 50 is an integrated circuit (IC) chip that outputs a drive signal for driving the piezoelectric elements 44 and a reference voltage. The drive circuit 50 is mounted at an upper main surface of the wiring substrate 46. The wiring substrate 46 is provided with wiring for an input signal to the drive circuit 50, the drive signal and the reference voltage output from the drive circuit 50.

Terminals (not shown) of the wiring substrate 46 and the piezoelectric elements 44 are bonded to each other via bumps B to be described later. The input signal to the drive circuit 50 is input to the terminals via, for example, flexible printed circuits (FPCs).

The housing portion 48 is a container that stores ink, and has a frame shape. When the droplet ejection head 1 is assembled, the pressure chamber substrate 34, the vibration plate 36, and the wiring substrate 46 are disposed in an internal space of the housing portion 48. Through holes 48*a* are formed on both sides of the housing portion 48 in the direction along the X axis.

Figure 3:
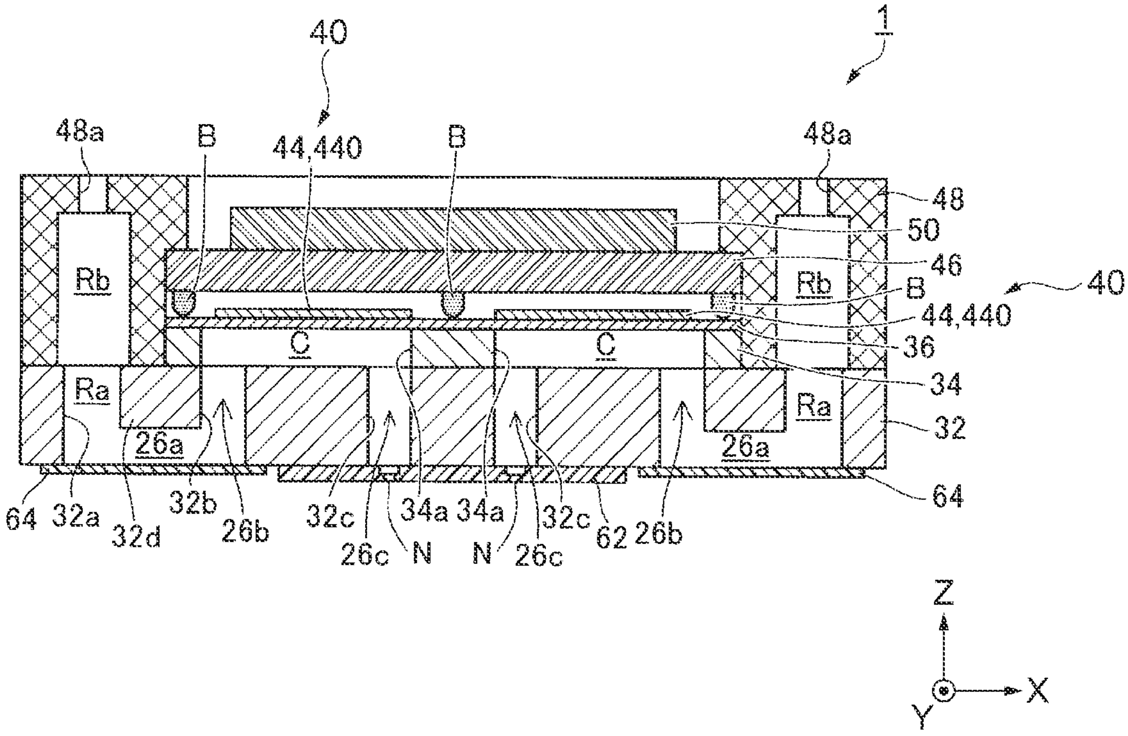
FIG. 3 is a schematic cross-sectional view taken along an XZ plane including a line A-A in FIG. 2.

As shown in FIG. 3, the wiring substrate 46, the vibration plate 36, and the pressure chamber substrate 34 are accommodated inside the frame shape of the housing portion 48. An outer edge of the frame shape of the housing portion 48 is in contact with an upper side of the flow path formation substrate 32. The nozzle plate 62 and the two vibration absorbers 64 are in contact with a lower side of the flow path formation substrate 32. Here, the droplet ejection head 1 has a configuration that is line-symmetrical in a left-right direction in FIG. 3. Therefore, a configuration in a −X direction that is a left side will be described in the following description, and description of a configuration in a +X direction will be omitted.

A space Rb is formed in the vicinity of an end portion of the housing portion 48 in the −X direction. An upper portion of the space Rb communicates with the through hole 48*a*, and a lower portion of the space Rb communicates with the first opening 32*a* in the flow path formation substrate 32. The space Rb extends in the direction along the Y axis corresponding to a planar shape of the first opening 32*a*.

The flow path formation substrate 32 is provided with a space Ra, a partition wall 32*d*, a supply flow path 26*b*, and a communication flow path 26*c*. The space Ra is an internal space formed by the first opening 32*a*. The partition wall 32*d* is provided between the first opening 32*a* and the second opening 32*b*. A lower end portion of the partition wall 32*d* is located above a lower surface of the flow path formation substrate 32 and is recessed in the +Z direction. A supply liquid chamber 26*a* is formed by the lower end portion of the partition wall 32*d* and an upper surface of the vibration absorber 64. The supply flow path 26*b* is an internal space formed by the second opening 32*b*.

The pressure chamber C is formed by the opening 34*a* in the pressure chamber substrate 34, the lower surface of the vibration plate 36, and an upper surface of the flow path formation substrate 32. That is, the vibration plate 36 forms an upper wall surface of the pressure chamber C, which is a part of a wall surface of the chamber C. The pressure chamber C communicates with the supply flow path 26*b* below an end portion in the −X direction.

The communication flow path 26*c* is an internal space formed by the third opening 32*c*. The pressure chamber C communicates with the communication flow path 26*c* below an end portion in the +X direction, and communicates with the nozzle N in the nozzle plate 62 via the communication flow path 26*c*.

As described above, an ink flow path is formed by communication in an order from the through hole 48*a* to the spaces Rb, Ra, the supply liquid chamber 26*a*, the supply flow path 26*b*, the pressure chamber C, the communication flow path 26*c*, and the nozzle N. In a configuration forming the ink flow path described above, a communication flow path 26*c* from the supply liquid chamber 26*a* is provided corresponding to each of the plurality of nozzles N.

The ink is supplied to the through hole 48*a* from the ink accommodating unit 7 described above. The spaces Ra, Rb function as liquid storage chambers that store the ink to be supplied to the pressure chamber C. The space Rb communicates with a plurality of spaces Ra arranged along the Y axis. The ink supplied from the through hole 48*a* is stored in the space Ra through the space Rb. The ink stored in the space Ra is supplied to the pressure chamber C via the supply liquid chamber 26*a* and the supply flow path 26*b*.

The piezoelectric element 44 overlaps the pressure chamber C in the plan view. That is, the piezoelectric elements 44 are provided corresponding to pressure chambers C respectively. Each piezoelectric element 44 includes an active portion 440 to be described later. The wiring substrate 46 is disposed above the piezoelectric element 44, and the drive circuit 50 is disposed above the wiring substrate 46. The wiring substrate 46 and the piezoelectric element 44 are electrically coupled by the bump B.

A drive signal and a reference voltage are input from the wiring substrate 46 to the piezoelectric element 44 via the bump B. A voltage is applied to the piezoelectric element 44 by an input of the drive signal and the reference voltage, and the piezoelectric element 44 is deformed. The vibration plate 36 vibrates in conjunction with deformation of the piezoelectric element 44. In this way, the ink is ejected from the nozzle N due to a pressure change in the pressure chamber C.

The vibration plate 36 is driven by the piezoelectric element 44. The drive circuit 50 described above applies the voltage to the piezoelectric element 44. The piezoelectric element 44, the vibration plate 36 serving as a drive unit, and the drive circuit 50 serving as a voltage application unit constitute an actuator for ejecting droplets.

1.3. Piezoelectric Element

Figure 4:
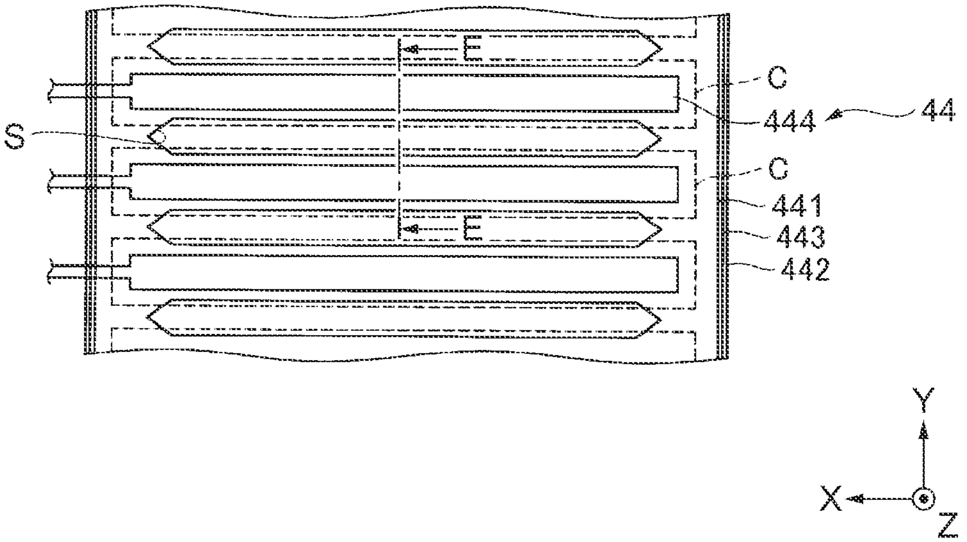
FIG. 4 is a plan view showing a configuration of a piezoelectric element.

A planar arrangement of the piezoelectric element 44 will be described. As shown in FIG. 4, the plurality of piezoelectric elements 44 are arranged adjacent to each other in the direction along the Y axis. The piezoelectric element 44 includes a lower electrode 441, a seed layer 442, a piezoelectric layer 443, an upper electrode 444, and the like. As will be described in detail later, the lower electrode 441, the seed layer 442, the piezoelectric layer 443, and the upper electrode 444 are laminated in this order from the vibration plate 36 upward in a direction along the Z axis. In the following description of FIG. 4, a state in the plan view will be described unless otherwise specified.

A plurality of upper electrodes 444 overlap the pressure chambers C in the direction along the Z axis, respectively. The upper electrode 444 extends from a substantially rectangular region overlapping the pressure chamber C in the +X direction. Although not shown, each upper electrode 444 is individually electrically coupled to the drive circuit 50 described above at a point where the upper electrode 444 extends in the +X direction.

In a manufacturing process of the piezoelectric element 44, the seed layer 442 and the piezoelectric layer 443 are formed in a substantially solid state so as to cover the lower electrode 441, and then only a region S is etched. That is, the seed layer 442 and the piezoelectric layer 443 are not disposed in the region S. The region S has a substantially hexagonal shape elongated in the direction along the X axis, and is formed between the upper electrodes 444 adjacent to each other in the direction along the Y axis.

The lower electrode 441 is formed in a solid state so as to cover the insulator layer 362. The lower electrode 441 is electrically coupled to the drive circuit 50 via a terminal (not shown). An individual voltage is applied to each upper electrode 444, whereas a common voltage is applied to the lower electrode 441.

Figure 5:
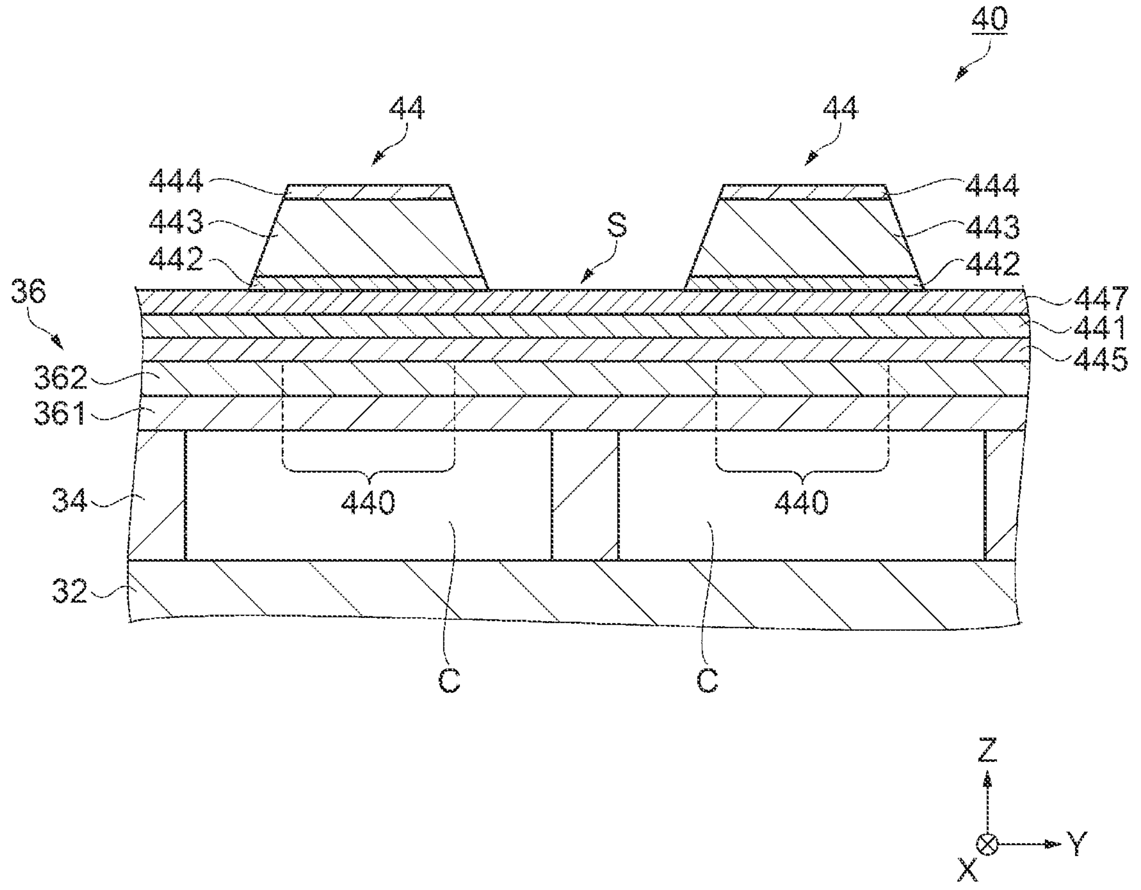
FIG. 5 is a cross-sectional view taken along a YZ plane including a line E-E in FIG. 4.

A detailed configuration of the piezoelectric element 44 will be described. As shown in FIG. 5, the plurality of piezoelectric elements 44 are formed in contact with the upper surface of the vibration plate 36. The region S is formed between two piezoelectric elements 44 adjacent to each other in the direction along the Y axis. In addition to the two piezoelectric elements 44, FIG. 5 also shows the vibration plate 36, the flow path formation substrate 32, and the pressure chamber substrate 34.

The piezoelectric element 44 includes an adhesion layer 445, the lower electrode 441, a diffusion reduction layer 447, the seed layer 442, the piezoelectric layer 443, and the upper electrode 444. In the piezoelectric element 44, the adhesion layer 445, the lower electrode 441, the diffusion reduction layer 447, the seed layer 442, the piezoelectric layer 443, and the upper electrode 444 are laminated upward in this order. That is, a lamination direction of layers of the piezoelectric element 44 is the direction along the Z axis.

A region where the adhesion layer 445, the lower electrode 441, the seed layer 442, the diffusion reduction layer 447, the piezoelectric layer 443, and the upper electrode 444 overlap in the plan view is referred to as the active portion 440. The active portion 440 is a region where the piezoelectric layer 443 is deformed when a voltage is applied between the lower electrode 441 and the upper electrode 444. The active portion 440 faces the pressure chamber C in the direction along the Z axis, with the vibration plate 36 interposed therebetween.

Here, the diffusion reduction layer 447 is formed in a solid shape. The diffusion reduction layer 447 may be discontinuously formed in the region S in the plan view, for example.

The seed layer 442 corresponding to each of the plurality of piezoelectric elements 44 is continuously formed in a region other than the region S in the plan view. The piezoelectric layer 443 corresponding to each of the plurality of piezoelectric elements 44 is continuously formed in the region other than the region S in the plan view.

The vibration plate 36 includes a silicon (Si) substrate 361 and the insulator layer 362. The silicon substrate 361 is made of a silicon single crystal. Although not shown, the silicon substrate 361 includes a silicon layer and a silicon oxide layer ($SiO_2$). The silicon oxide layer is disposed above the silicon layer, and the silicon oxide layer and the insulator layer 362 are in contact with each other. A silicon-on-insulator (SOI) substrate, a glass substrate, or the like may be used instead of the silicon substrate 361. The insulator layer 362 contains zirconium oxide ($ZrO_2$).

The adhesion layer 445 is formed at the vibration plate 36, specifically, at a position in contact with an upper surface of the insulator layer 362 and overlapping the active portion 440 in the plan view. The adhesion layer 445 contains titanium (Ti). The titanium contained in the adhesion layer 445 may be derived from titanium oxide ($TiO_2$).

Here, residual stress may be generated inside the piezoelectric layer 443 due to a difference in linear expansion coefficient or a difference in lattice spacing between the piezoelectric layer 443 and the vibration plate 36. On the other hand, when the adhesion layer 445 contains titanium, the residual stress is likely to be relaxed. Zirconium or zinc (Zn) may be used for the adhesion layer 445 instead of titanium.

The lower electrode 441 is formed at the adhesion layer 445, specifically, in contact with an upper surface of the adhesion layer 445. The lower electrode 441 contains platinum (Pt). The lower electrode 441 is not limited to a single layer of platinum, and may be a single layer of a conductive oxide film such as $IrO_x$, $LaNiO_3$, or $SrRuO_3$, or may have a configuration in which two or more single layers of the above material are laminated.

The diffusion reduction layer 447 is formed in a solid state so as to cover the lower electrode 441. Specifically, the diffusion suppression layer 447 is formed to cover both lateral sides of each of the adhesion layer 445 and the lower electrode 441, an upper side of the lower electrode 441, and a part of an upper side of the vibration plate 36 on both lateral sides of the adhesion layer 445. In other words, the diffusion reduction layer 447 is interposed between the adhesion layer 445 and the lower electrode 441, and the seed layer 442 and the piezoelectric layer 443. Therefore, diffusion of titanium is also reduced at an interface between the diffusion reduction layer 447 and the vibration plate 36.

The diffusion reduction layer 447 contains iridium (Ir). Accordingly, diffusion of titanium contained in the adhesion layer 445 into the piezoelectric layer 443 is reduced. The diffusion reduction layer 447 may contain iridium oxide ($IrO_x$). The iridium oxide may be generated by oxidation of iridium in a heat treatment or the like in the manufacturing process of the piezoelectric element 44.

A thickness of the diffusion reduction layer 447 is not particularly limited, and is 3 nm to 50 nm, for example.

The seed layer 442 is formed at the diffusion reduction layer 447, specifically, to cover the diffusion reduction layer 447. The seed layer 442 controls a crystal orientation of a composite oxide in the piezoelectric layer 443 in alignment. The seed layer 442 promotes a preferential orientation of a crystal of the piezoelectric layer 443 to a (100) plane.

The seed layer 442 is a composite oxide containing bismuth (Bi), titanium (Ti), iron (Fe), and lead (Pb) and having a perovskite structure. Although the seed layer 442 contains titanium, which may advance a growth of KNN crystal grains oriented to a (111) plane in the piezoelectric layer 443, the applicant has found that the crystal orientation to the (100) plane is promoted in the composite oxide of the piezoelectric layer 443 as a result of research. Therefore, occurrence of cracks due to crystal grain boundaries is further prevented, and electrical characteristics of the piezoelectric element 44 are improved.

A composition of elements of the seed layer 442 is not particularly limited, and for example, a molar ratio of each element is 0.1 for lead, 1.1 for bismuth, 0.5 for iron, 0.5 for titanium, and 3.0 for oxygen (O). These compositions are adjusted by, for example, the molar ratio of each element in a precursor solution of the seed layer 442 when the seed layer 442 is being manufactured. Since the seed layer 442 has a relatively high dielectric constant, a displacement efficiency indicated by a displacement amount of the piezoelectric layer 443 with respect to the applied voltage is high. A method for manufacturing the piezoelectric element 44 will be described later.

A thickness of the seed layer 442 is 20 nm or less. According to this, since the seed layer 442 contains bismuth, iron, titanium, and lead, an effect of aligning the orientation of the crystal of the composite oxide is ensured even when the thickness is 20 nm or less. Since the above thickness is relatively small, diffusion of titanium contained in the seed layer 442 to the piezoelectric layer 443 is reduced.

The seed layer 442 is not limited to the perovskite structure. The seed layer 442 may have an octahedral crystal structure in which six oxygen atoms are coordinated to iron or titanium as a structure similar to the perovskite structure.

The piezoelectric layer 443 is a main part of the piezoelectric element 44 having piezoelectricity, and is deformed by application of a voltage. The piezoelectric layer 443 is formed at and in contact with the seed layer 442, and covers an upper side of the seed layer 442. The piezoelectric layer 443 contains potassium (K), sodium (Na), and niobium (Nb), and is mainly made of a composite oxide having a perovskite structure represented by a general formula $ABO_3$. Specifically, the composite oxide is represented by the following formula (1).

$$(K_m,Na_{1-m})NbO_3 \quad (1)$$

The formula (1) satisfies $0.1 \leq m \leq 0.9$.

A potassium sodium niobate-based composite oxide represented by the formula (1) is a lead-free piezoelectric material in which a content of lead or the like is reduced, and is a so-called KNN composite oxide. The KNN-based composite oxide is advantageous for reducing an environmental load, and is excellent in piezoelectric characteristics as compared with other lead-free piezoelectric materials. Further, the KNN-based composite oxide has a higher Curie temperature than other lead-free piezoelectric materials such as BNT-BKT-BT, and is less likely to undergo depolarization due to temperature rise, which is advantageous for use at high temperatures.

In the formula (1), a content of potassium is preferably 30 mol % or more and 70 mol % or less with respect to a total amount of metal elements constituting an A site of $ABO_3$. That is, m preferably satisfies $0.3 \leq m \leq 0.7$. The content of potassium is more preferably 40 mol % or more and 60 mol % or less with respect to the total amount of the metal elements constituting the A site. That is, m more preferably satisfies $0.4 \leq m \leq 0.6$. This improves the piezoelectric characteristics of the piezoelectric layer 443.

The piezoelectric layer 443 may contain other metal elements such as lithium and a first transition element in addition to the KNN-based composite oxide represented by the formula (1). The piezoelectric layer 443 may include a piezoelectric material that is a mixed crystal including potassium, sodium, and niobium of a composite oxide having a perovskite structure represented by the general formula $ABO_3$ and another composite oxide having a perovskite structure represented by the general formula $ABO_3$. The piezoelectric material included in the piezoelectric layer 443 may include a material having a composition in which a part of the above elements is missing, a material having a composition in which a part of the above elements is excessive, and the like.

The piezoelectric layer 443 is crystal-oriented in a {100} orientation. That is, the piezoelectric layer 443 is preferentially oriented to the (100) plane. This further improves the piezoelectric characteristics of the piezoelectric element 44. In the present specification, the preferential orientation means that 50% or more, preferably 80% or more in the crystal is oriented to a predetermined crystal plane. Specifically, the preferential orientation to the (100) plane includes a case where all in the crystal of the piezoelectric layer 443 is oriented to the (100) plane and a case where at least 50% in the crystal is oriented to the (100) plane. The crystal orientation of the piezoelectric layer 443 can be known by analyzing an X-ray diffraction intensity curve of an X-ray diffraction (XRD) method.

A thickness of the piezoelectric layer 443 is not particularly limited, and is 500 nm to 2000 nm, for example.

Here, when an element concentration of the piezoelectric layer 443 in a depth direction from an upper surface is measured by secondary ion mass spectrometry (SIMS), a detected titanium intensity slightly increases on a side closer to the adhesion layer 445, which is the lower side. In the embodiment, diffusion of titanium is reduced by the diffusion reduction layer 447. Therefore, in the piezoelectric layer 443, in a region where a distance from the seed layer 442 in the lamination direction, that is, a distance in the direction along the Z axis is 240 nm or more, the titanium intensity measured by SIMS is 300 cps or less. Accordingly, a crystal orientation to an unintended plane such as a (111) plane is further prevented in the piezoelectric layer 443.

The upper electrode 444 is formed at the piezoelectric layer 443. The upper electrode 444 is provided at the piezoelectric layer 443. The upper electrode 444 is formed of a platinum layer. The upper electrode 444 is not limited to the platinum layer, and may be a single layer of a metal material such as aluminum, nickel, gold, and copper, or may have a configuration in which two or more single layers of the metal material are laminated.

In the embodiment, the piezoelectric element 44 in which the lower electrode 441, the seed layer 442, the piezoelectric layer 443, the upper electrode 444, and the like are sequentially laminated on the vibration plate 36 is exemplified, but the present disclosure is not limited thereto. The piezoelectric element according to the present disclosure may be a vertical vibration type piezoelectric element in which a piezoelectric material, an electrode formation material, and the like are alternately laminated and that expands and contracts in an axial direction.

1.4. Method for Manufacturing Piezoelectric Element

First, the vibration plate 36 is manufactured. Specifically, a silicon plate is thermally oxidized to form silicon oxide at an upper surface. Accordingly, the silicon substrate 361 including a silicon layer and a silicon oxide layer is formed. Next, the silicon oxide layer is coated with a zirconium layer by sputtering, and then the zirconium layer is thermally oxidized to form a zirconium oxide layer as the insulator layer 362.

Next, the adhesion layer 445 and the lower electrode 441 are formed. Specifically, a titanium layer, a platinum layer, and then a layer containing iridium are laminated in this order in a solid state on an upper surface of the insulator layer 362 by sputtering.

Next, a layer to be the seed layer 442 is formed by metal organic decomposition (MOD). Specifically, a propionic acid solution of lead, bismuth, iron, and titanium is prepared as a precursor solution of the seed layer 442. At this time, a molar ratio of each element is, for example, lead:bismuth:iron:titanium=10:110:50:50. The propionic acid solution is applied to an upper side of the diffusion reduction layer 447 by spin coating.

Thereafter, drying and degreasing are performed at 350° C. using a hot plate, and then a heat treatment is performed at 650° C. for three minutes in an oxygen atmosphere by rapid thermal annealing (RTA) using an infrared lamp or the like. Accordingly, a solid layer including the seed layer 442 is formed.

Next, a layer to be the piezoelectric layer 443 is formed by MOD. First, a precursor solution of the above layer is prepared. The precursor solution contains, as solutes, metal complexes of elements contained in the piezoelectric layer 443, such as potassium, sodium, and niobium. A solvent of the precursor solution is an organic solvent capable of dissolving or dispersing the metal complexes.

Specifically, potassium 2-ethylhexanoate, sodium 2-ethylhexanoate, niobium 2-ethylhexanoate, or the like is used as the metal complexes. For example, an organic solvent alone, such as 2-n-butoxyethanol or n-octane, or a mixed solution thereof is used as the solvent. A content of each metal complex in the precursor solution corresponds to a desired molar ratio of each element of the piezoelectric layer 443.

The precursor solution is applied onto the layer including the seed layer 442 by spin coating. Next, drying is performed at 180° C. using a hot plate, degreasing is performed at 380° C., and then a heat treatment is performed at 750° C. for three minutes in an oxygen atmosphere by RTA. This promotes crystallization of a composite oxide of the piezoelectric layer 443. Then, a solid layer including the piezoelectric layer 443 is formed. In order to ensure a thickness of the piezoelectric layer 443, steps from application of the precursor solution to the heat treatment by RTA are repeated.

Here, in the related-art piezoelectric element, diffusion of titanium proceeds due to the heat treatment on a precursor solution of the piezoelectric layer. When steps from application of the precursor solution to the heat treatment are repeated, the diffusion of titanium further proceeds. In contrast, in the piezoelectric element 44 according to the embodiment, diffusion of titanium into the piezoelectric layer 443 is reduced by the diffusion reduction layer 447.

A method for manufacturing the seed layer 442 and the piezoelectric layer 443 is not limited to MOD. A known method such as gas phase method can be applied to manufacture of the piezoelectric layer 443.

Next, a layer to be the upper electrode 444 is formed. Specifically, a platinum layer is formed in a solid state at an upper surface of the layer to be the piezoelectric layer 443 by sputtering.

Next, the region S is formed by patterning. Specifically, in the layer including the seed layer 442, the layer to be the piezoelectric layer 443, and the layer to be the upper electrode 444, a region corresponding to the region S is removed to form the seed layer 442, the piezoelectric layer 443, and the upper electrode 444. Examples of a method for patterning include dry etching such as reactive ion etching and ion milling, and wet etching using an etchant. As described above, the piezoelectric element 44 is manufactured.

According to the embodiment, the following effects can be attained.

In the piezoelectric layer 443, occurrence of cracks can be prevented. Specifically, diffusion of titanium of the adhesion layer 445 into the piezoelectric layer 443 is reduced by the diffusion reduction layer 447 containing iridium. Therefore, in the piezoelectric layer 443, crystal grains oriented in an unintended plane are less likely to grow. A difference in linear expansion coefficient between the piezoelectric layer 443 and the vibration plate 36 is more likely to be reduced than in a case where an adhesion layer not containing titanium is formed or in a case where the adhesion layer 445 is omitted. Accordingly, cracks are less likely to occur even when the piezoelectric layer 443 is formed to be relatively thick. Therefore, it is possible to provide a piezoelectric element 44 that prevents the occurrence of cracks in the piezoelectric layer 443.

2. Examples and Comparative Examples

Hereinafter, the effects of the above embodiment will be described in more detail with reference to an example and comparative examples. For each of Example 1 and Comparative Examples 1 to 4, a configuration and evaluation results of a piezoelectric element are shown in Table 1.

TABLE 1

| | Configuration of Piezoelectric Element | | | | | | |
|---|---|---|---|---|---|---|---|
| | Insulator Layer | Adhesion Layer | Lower Electrode | Diffusion Reduction Layer | Additional Layer | Seed Layer | Piezoelectric Layer |
| Example 1 | $ZrO_2$ (400 nm) | Ti (20 nm) | Pt (80 nm) | Ir (5 nm) | Absent | Bi, Fe, Ti, Pb (20 nm) | K, Na, Nb <10 Layers> |
| Comparative Example 1 | $ZrO_2$ (400 nm) | Ti (20 nm) | Pt (80 nm) | Ir (5 nm) | Ti (4 nm) | Bi, Fe, Ti, Pb (20 nm) | K, Na, Nb <10 Layers> |
| Comparative Example 2 | $ZrO_2$ (400 nm) | Absent | Pt (80 nm) | Ir (5 nm) | Absent | Bi, Fe, Ti, Pb (20 nm) | K, Na, Nb <7 Layers> |
| Comparative Example 3 | $ZrO_2$ (400 nm) | Ti (20 nm) | Pt (80 nm) | Absent | Absent | Bi, Fe, Ti, Pb (20 nm) | K, Na, Nb <9 Layers> |
| Comparative Example 4 | $ZrO_2$ (400 nm) | Zr (10 nm) | Pt (80 nm) | Absent | Absent | Bi, Fe, Ti, Pb (20 nm) | K, Na, Nb <6 Layers> |

| | Evaluation Result | | |
|---|---|---|---|
| | Crack in Piezoelectric Layer | (111) Crystal Grain | Ti Diffusion |
| Example 1 | Not Occurred at 790 nm | Absent | 2nd Layer |
| Comparative Example 1 | Occurred at 790 nm | Present | 10th Layer |

TABLE 1-continued

| | | | | |
|---|---|---|---|---|
| | Comparative Example 2 | Occurred at 540 nm | Absent | 3rd Layer |
| | Comparative Example 3 | Occurred at 670 nm | Present | 9th Layer |
| | Comparative Example 4 | Occurred at 450 nm | Absent | 1st Layer |

In the configuration of the piezoelectric element in Table 1, a thickness of a layer other than the piezoelectric layer is shown in parentheses ( ) and the number of laminated piezoelectric layers is shown in parentheses < >. The column of Ti diffusion in the evaluation results in Table 1 shows a layer at which the titanium intensity measured by SIMS exceeded 200 cps.

2.1. Manufacture of Piezoelectric Element

In the piezoelectric element according to each of Example 1 and Comparative Examples 1 to 4, a molar ratio of each element contained in a seed layer was bismuth:iron:titanium: lead=110:50:50:10. The molar ratio of each element contained in the piezoelectric layer was potassium:sodium=51:49, and an element disposed at an A site: an element disposed at a B site=107:100. A main element disposed at the A site is potassium or sodium, and a main element disposed at the B site is niobium.

In Example 1, the adhesion layer 445, the diffusion reduction layer 447, the seed layer 442, and the piezoelectric layer 443 were manufactured by being laminated from the insulator layer 362 of the vibration plate 36 by the manufacturing method described above. By repeating the steps from the application of the precursor solution to the heat treatment, 10 piezoelectric layers 443 were laminated. In this evaluation, formation of the upper electrode 444 is omitted because measurement of electrical characteristics and the like is not performed.

In Comparative Example 1, an additional layer made of titanium was formed between the diffusion reduction layer and the seed layer in the same manner as the adhesion layer 445 in Example 1. Lamination of the piezoelectric layers was repeated until a crack occurred after the heat treatment. Repetition of the lamination was performed in the same manner in the following Comparative Examples 2, 3, and 4.

Comparative Example 2 was the same as Example 1 except that the adhesion layer 445 was omitted. Comparative Example 3 was the same as Example 1 except that the diffusion reduction layer 447 was omitted. Comparative Example 4 was the same as Comparative Example 3 except that the adhesion layer was a zirconium layer and a thickness thereof was 10 nm.

2.2. Evaluation on Piezoelectric Element

2.2.1. Crack Occurrence

An upper surface of the piezoelectric layer was observed with a metallurgical microscope to examine presence or absence of cracks. As a result, in Example 1, no cracks occurred even when 10 piezoelectric layers 443 were laminated and a thickness thereof was 790 nm. In Comparative Example 1, cracks occurred when 10 piezoelectric layers were laminated and a thickness thereof was 790 nm. In Comparative Example 2, cracks occurred when seven piezoelectric layers were laminated and a thickness thereof was 540 nm. In Comparative Example 3, cracks occurred when nine piezoelectric layers were laminated and a thickness thereof was 670 nm. In Comparative Example 4, cracks occurred when six piezoelectric layers were laminated and a thickness thereof was 450 nm. In Example 1, no cracks occurred even when 15 piezoelectric layers 443 were separately laminated and a thickness thereof was 1200 nm.

As described above, it was shown that occurrence of cracks was prevented even when the piezoelectric layer 443 was formed to be relatively thick in Example 1. On the other hand, in Comparative Examples 1 to 4, it was found that cracks were likely to occur when the piezoelectric layer was formed to be relatively thick.

2.2.2. Analysis on Crystal Orientation

Each of the piezoelectric layers was measured by X-ray diffraction. Accordingly, a state of orientation to a (100) plane, a (111) plane, and a (110) plane was investigated by an X-ray diffraction intensity curve. Specifically, a D8 DISCOVER with GADDS manufactured by Bruker was used as an X-ray diffractometer. Measurement conditions included a tube voltage of 50 kV, a tube current of 100 mA, a detector distance of 15 cm, a collimator diameter of 0.3 mm, and a measurement time of 120 seconds. The (111) plane was measured by inclining the silicon substrate by 54.74°.

Figure 6:
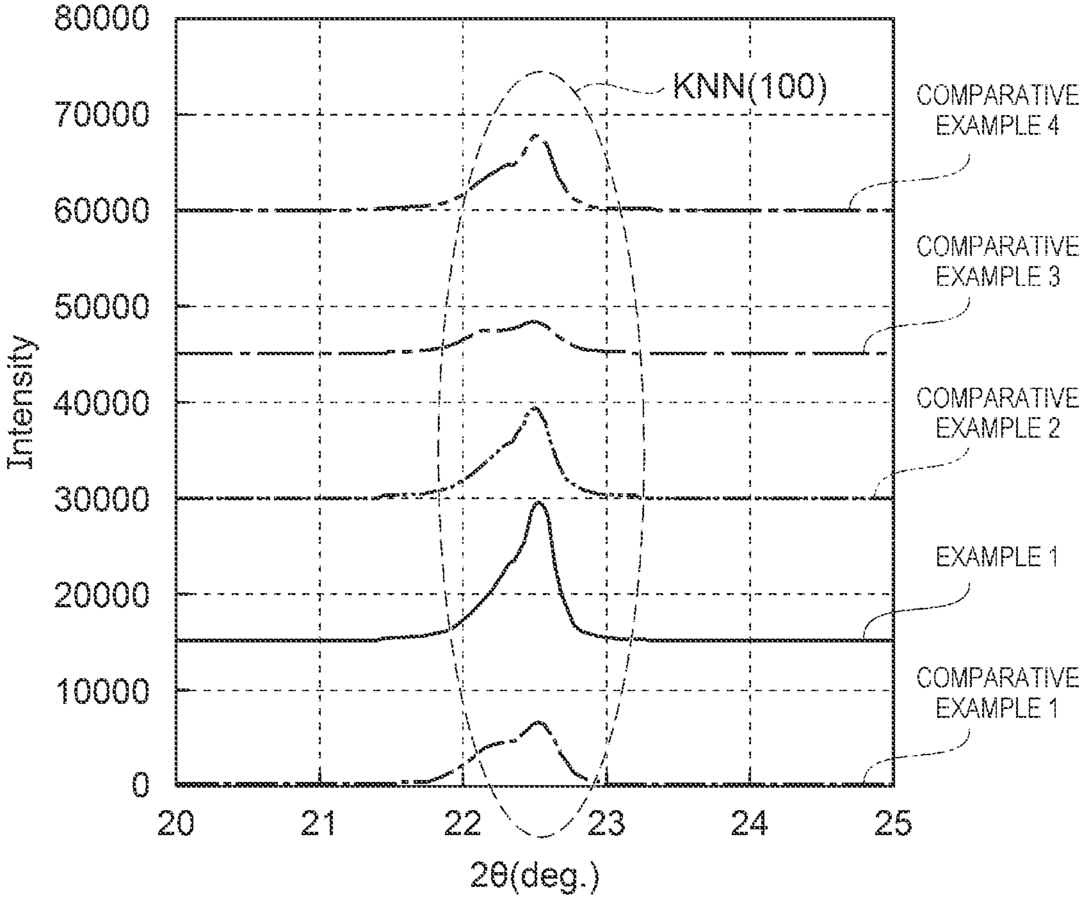
FIG. 6 shows X-ray diffraction intensity curves of an example and comparative examples.
Figure 7:
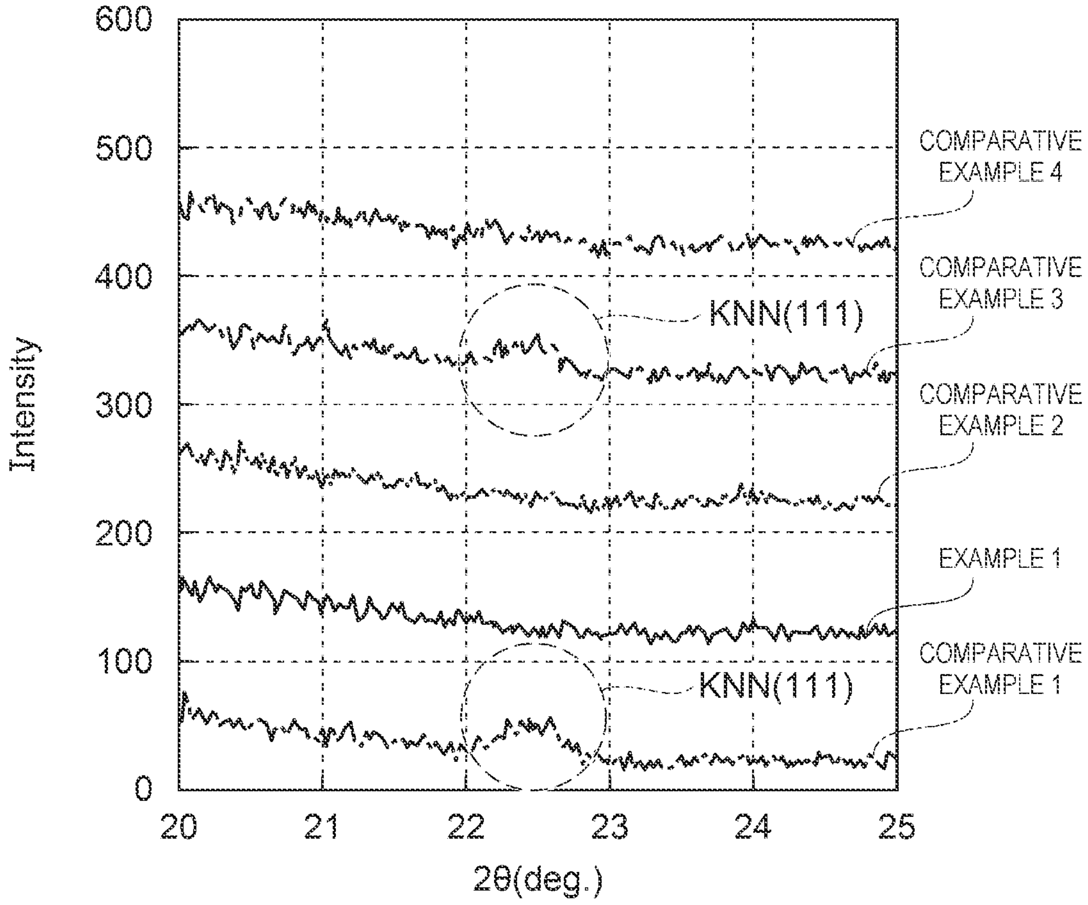
FIG. 7 shows X-ray diffraction intensity curves of the example and the comparative examples.
Figure 8:
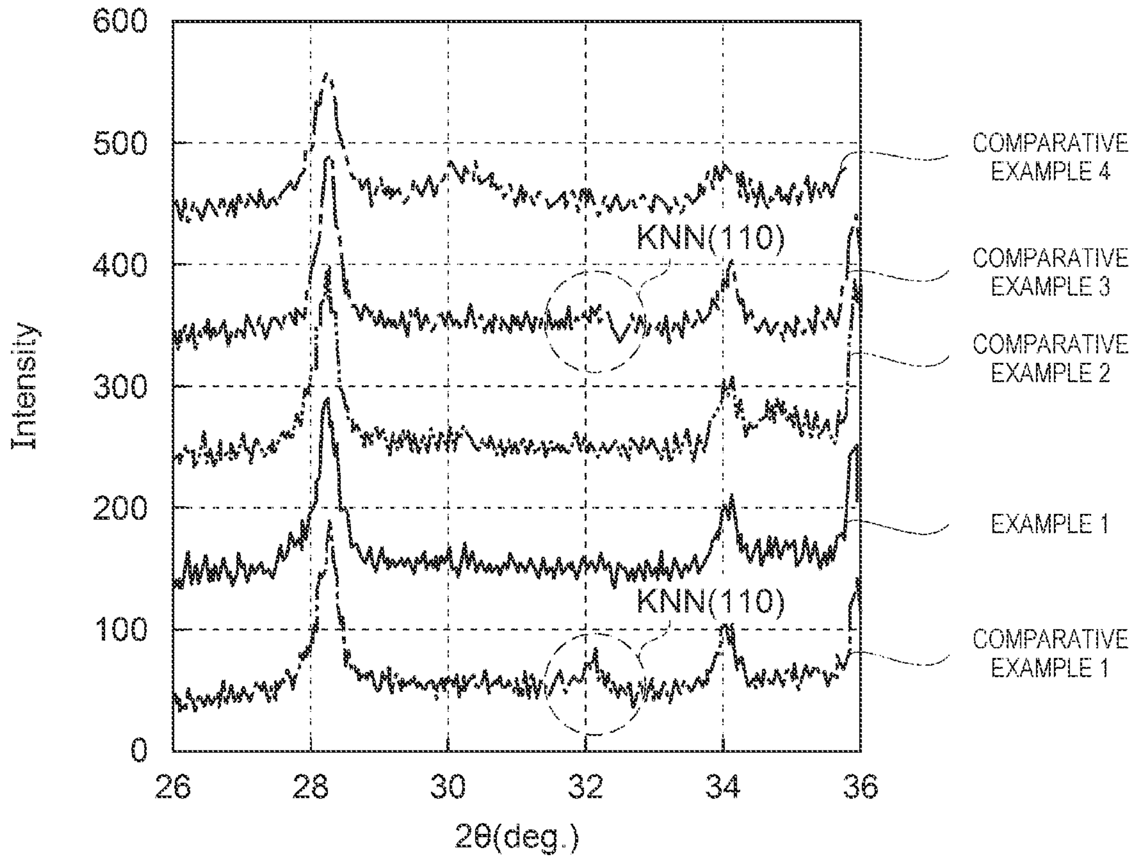
FIG. 8 shows X-ray diffraction intensity curves of the example and the comparative examples.

The obtained two-dimensional data was converted into an X-ray diffraction intensity curve by software attached to the apparatus with a 2θ range of 20° to 50°, a λ range of −95° to −85°, a step width of 0.02°, and an intensity normalization method of Bin normalized. FIG. 6 shows a range corresponding to the (100) plane of the KNN in an enlarged manner, FIG. 7 shows a range corresponding to the (111) plane of the KNN in an enlarged manner, and FIG. 8 shows a range corresponding to the (110) plane of the KNN in an enlarged manner. In FIGS. 6 to 8, a horizontal axis represents 2θ (degree) as an X-ray diffraction angle, and a vertical axis represents a diffraction intensity.

As shown in FIGS. 6 to 8, in Example 1, Comparative Example 2, and Comparative Example 4, peaks of the (111) plane and the (110) plane were not observed, and it was found that the (100) plane was preferentially oriented. On the other hand, in Comparative Example 1 and Comparative Example 3, peaks of the (111) plane and the (110) plane were observed, and a half-value width of the peak of the (100) plane was wider than a half-value width of the peak of the (100) plane in Example 1, Comparative Example 2, and Comparative Example 4. Accordingly, it was found that Comparative Example 1 and Comparative Example 3 were mixed crystals.

2.2.3. Observation on Crystal Grain Boundary

Crystal grain boundaries of the piezoelectric layer were observed. Specifically, a cross section of the piezoelectric layer along the Z axis and the upper surface were observed with a scanning electron microscope (SEM) S-4700 manufactured by Hitachi High-Technologies Corporation. FIGS.

Figure 11:
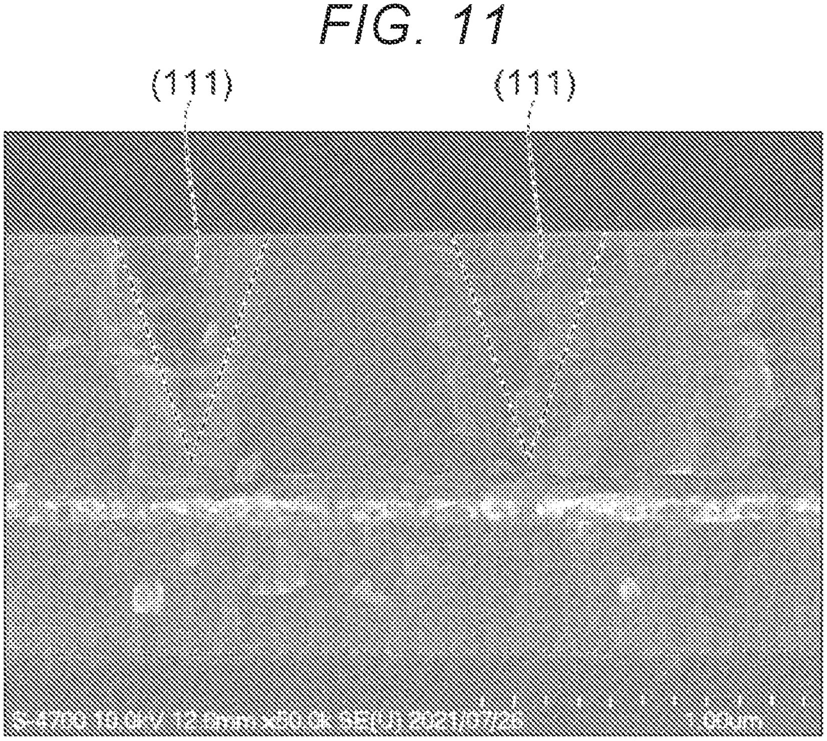
FIG. 11 is a cross-sectional SEM photograph of a piezoelectric layer according to Comparative Example 1.
Figure 12:
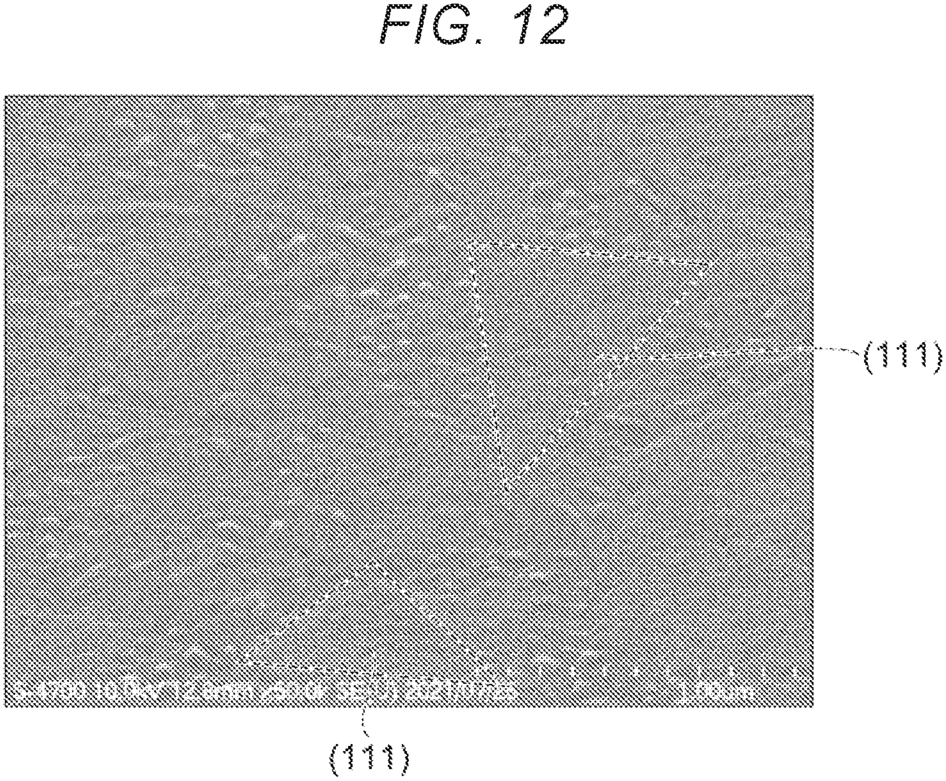
FIG. 12 is a planar SEM photograph of the piezoelectric layer according to Comparative Example 1.

9 and 10 show SEM photographs of Example 1, and FIGS. 11 and 12 show SEM photographs of Comparative Example 1.

Figure 9:
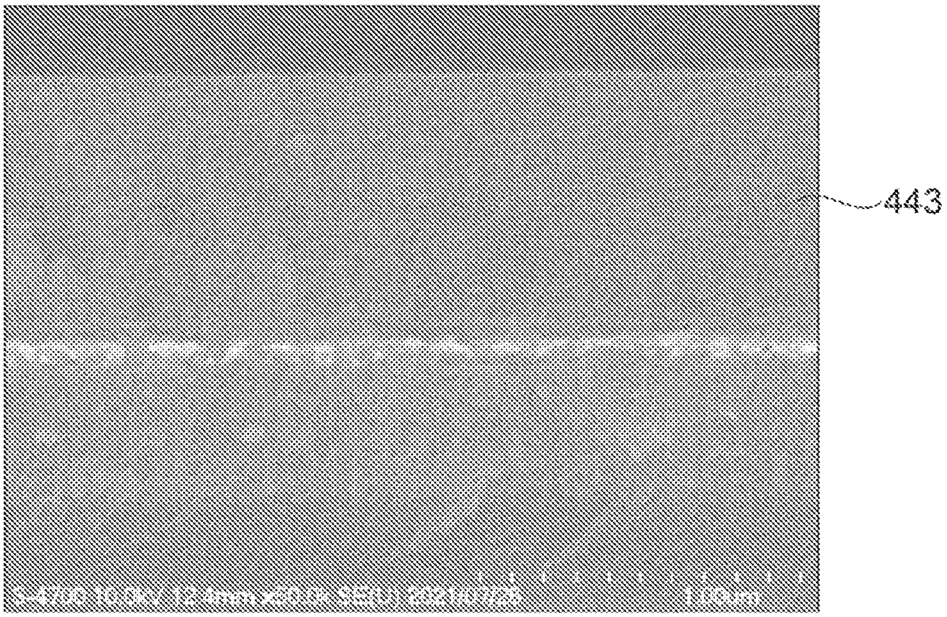
FIG. 9 is a cross-sectional SEM photograph of a piezoelectric layer according to Example 1.
Figure 10:
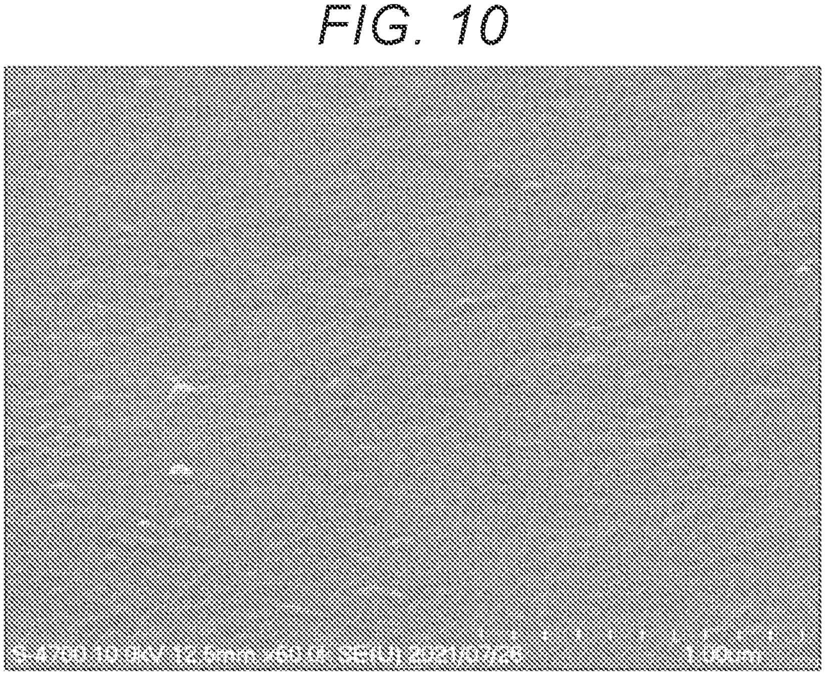
FIG. 10 is a planar SEM photograph of the piezoelectric layer according to Example 1.

In Example 1, as shown in FIGS. 9 and 10, no crystal grain boundary was observed in the piezoelectric layer 443. On the other hand, in Comparative Example 1, as shown in FIGS. 11 and 12, crystal grain boundaries indicated by triangular broken lines were observed. In addition to a result of the X-ray diffraction described above, it was found that triangular pyramid-shaped regions oriented to the (111) plane were generated in Comparative Example 1. Therefore, in Comparative Example 1, cracks may occur along the crystal grain boundaries. Although not shown, as a result of performing the same observation as described above for Comparative Example 2, Comparative Example 3, and Comparative Example 4, no crystal grain boundaries was observed in Comparative Example 2 or Comparative Example 4, and crystal grain boundaries were observed in Comparative Example 3.

2.2.4. Analysis on Titanium Diffusion in Piezoelectric Layer

The piezoelectric layer according to each of Example 1, Comparative Example 1, and Comparative Example 2 was subjected to composition analysis in the −Z direction, which is a depth direction, from the upper surface of the piezoelectric layer toward the seed layer by SIMS.

A sector type SIMS IMS-7f manufactured by CAMECA was used as a SIMS apparatus. In the measurement, cesium ions ($Cs^+$) of 15 kV were used as a primary ion, and a 100 μm square was raster-scanned with a beam current of 10 nA to detect negative secondary ions from a center of 33 μmφ. At the time of measurement, charge-up was limited using an electron gun.

Figure 13:
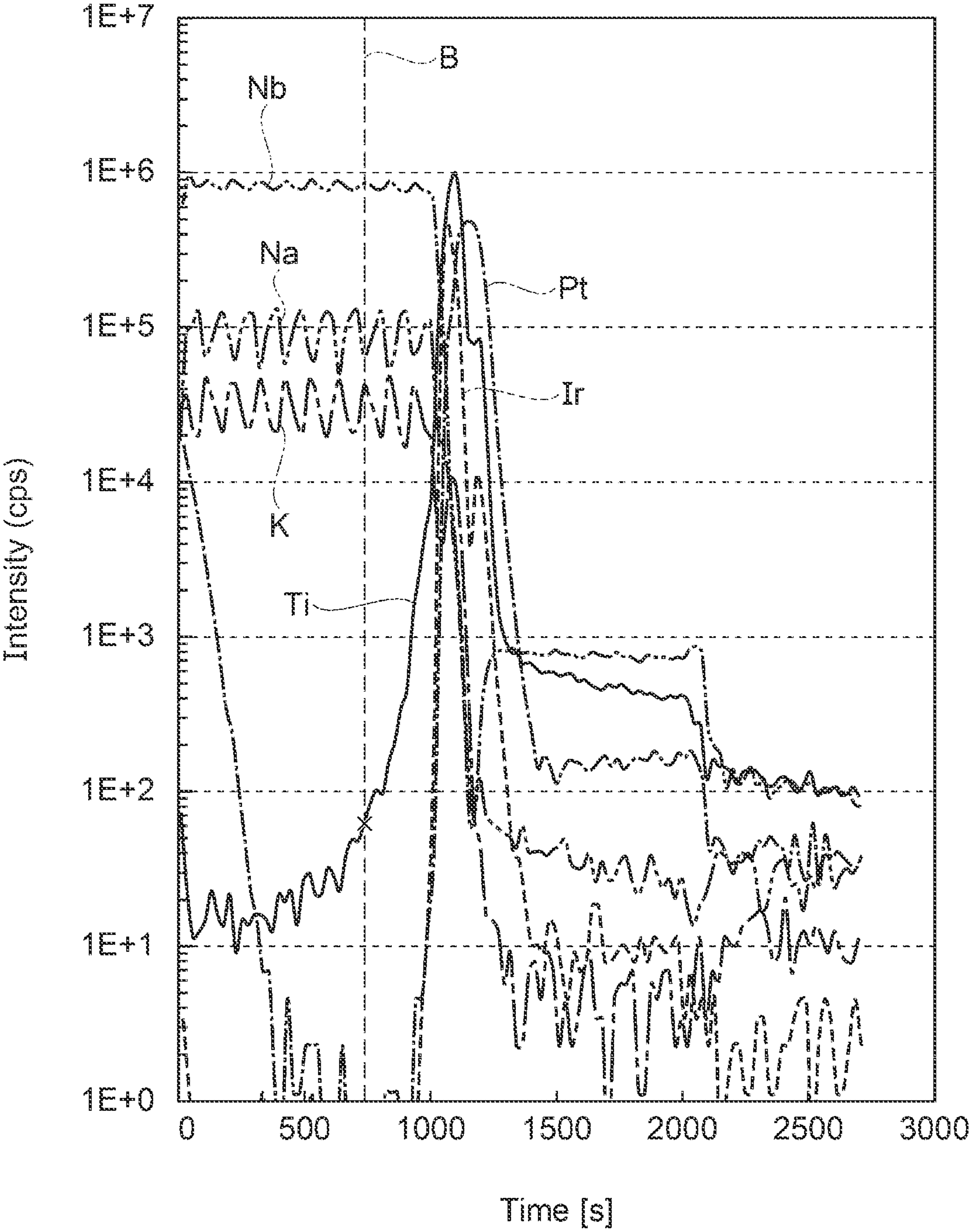
FIG. 13 is a diagram showing a profile in a depth direction according to Example 1 measured by SIMS.
Figure 14:
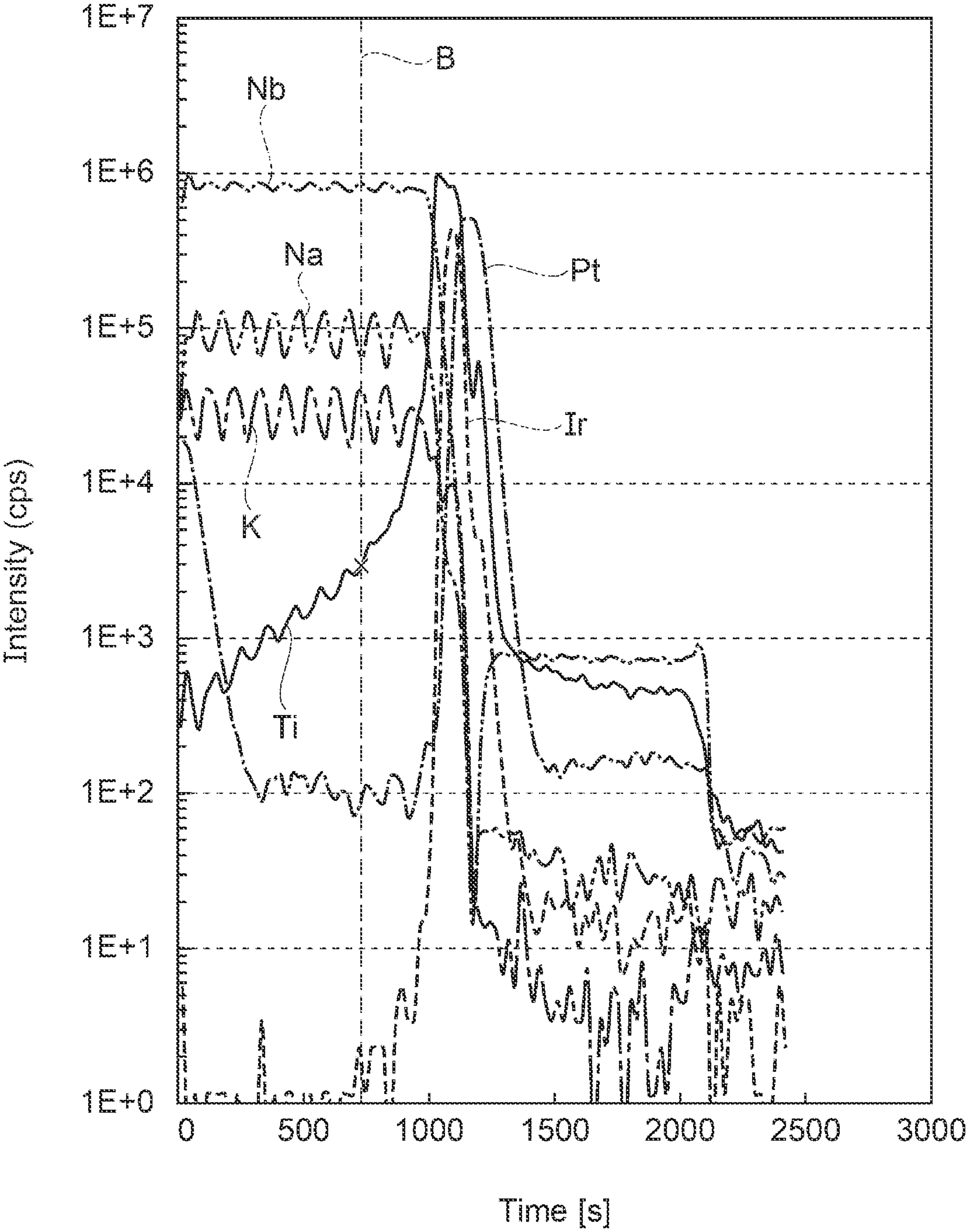
FIG. 14 is a diagram showing a profile in a depth direction according to Comparative Example 1 measured by SIMS.
Figure 15:
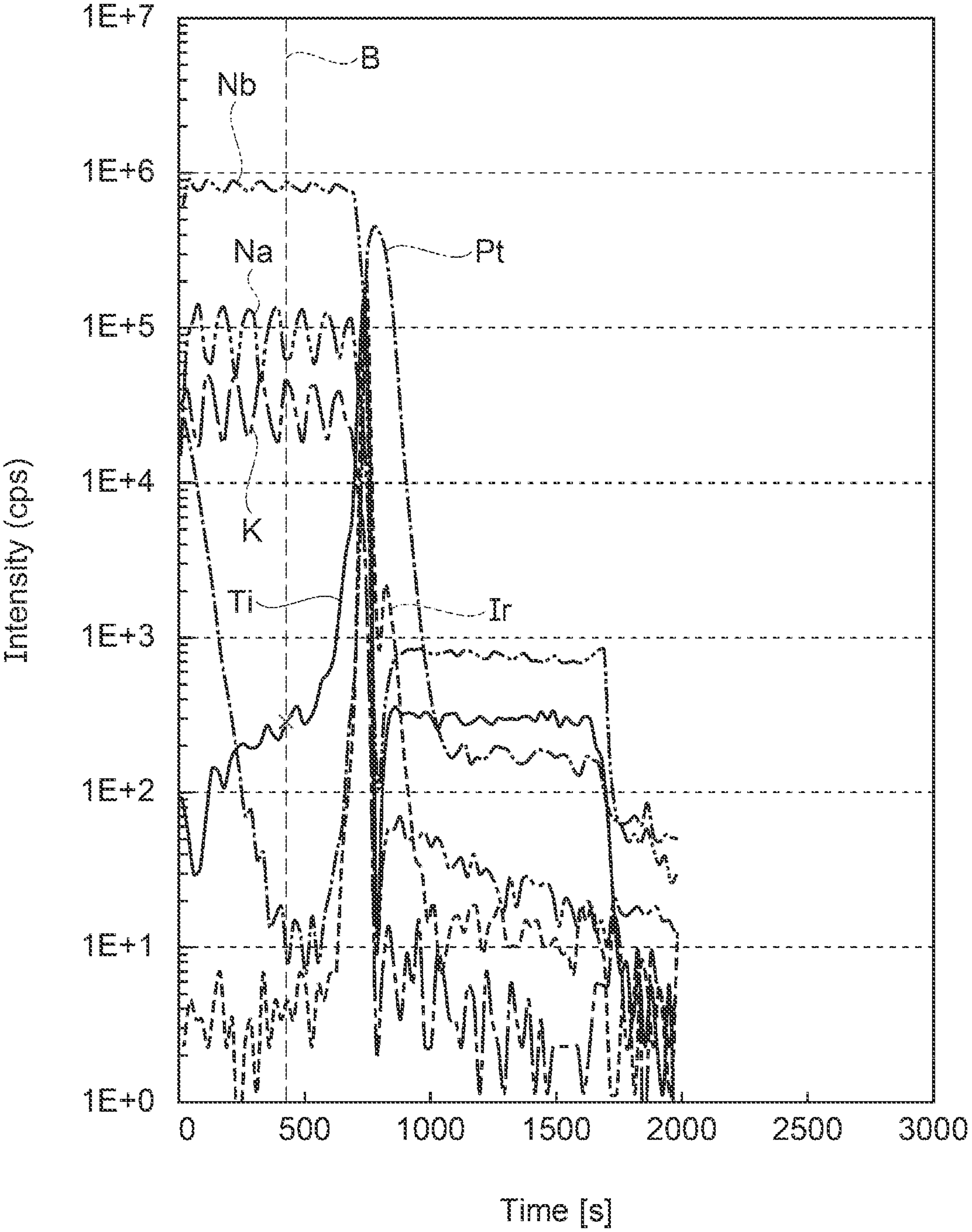
FIG. 15 is a diagram showing a profile in a depth direction according to Comparative Example 2 measured by SIMS.
Figure 16:
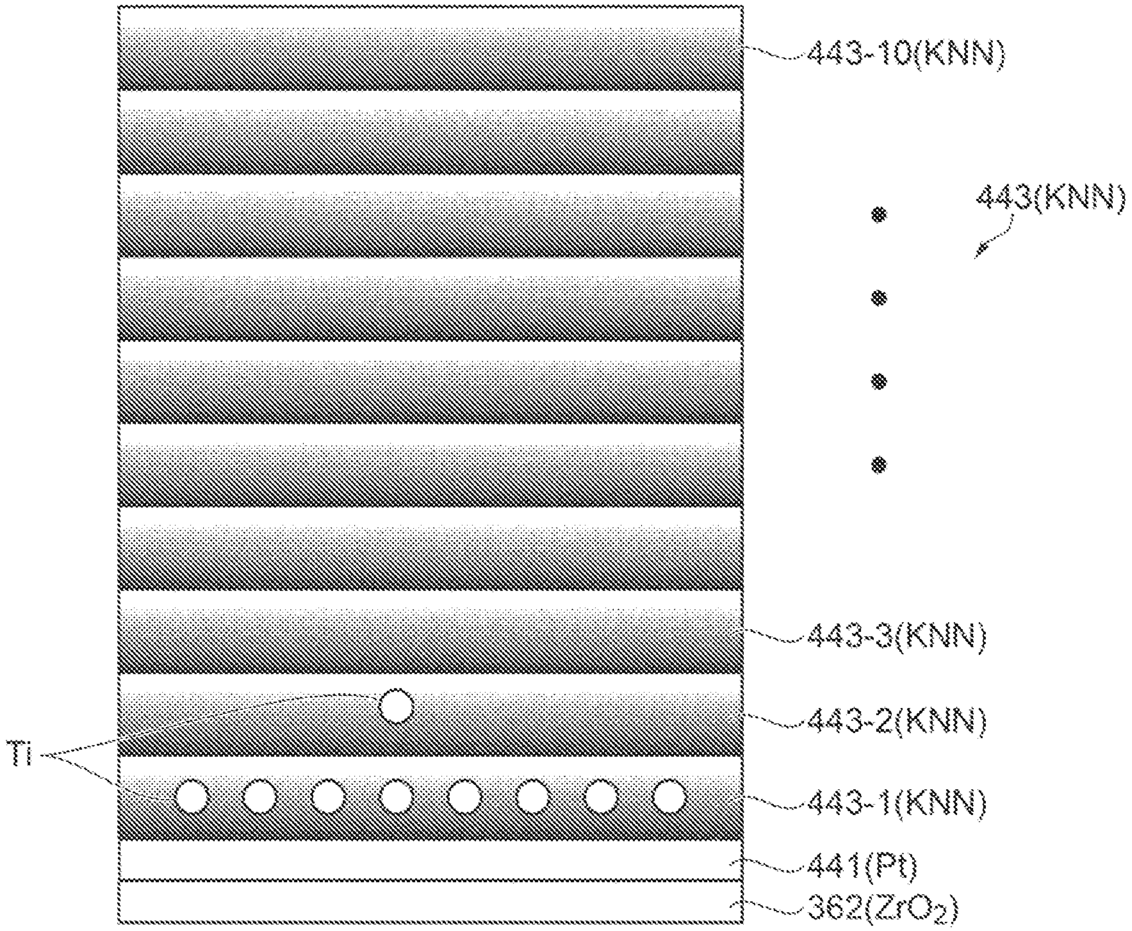
FIG. 16 is a schematic cross-sectional view showing a diffusion state of titanium in the piezoelectric layer according to Example 1.
Figure 17:
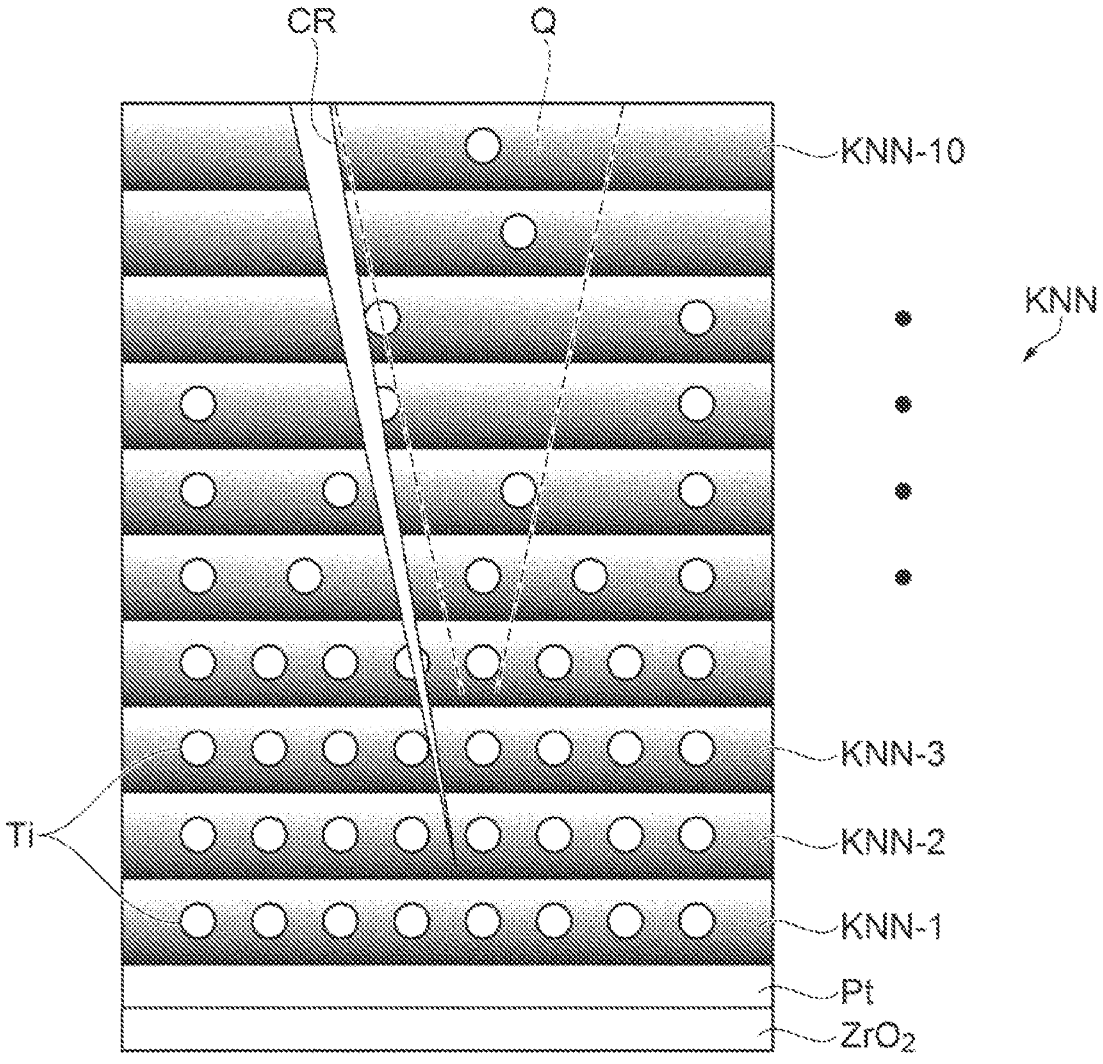
FIG. 17 is a schematic cross-sectional view showing a diffusion state of titanium in the piezoelectric layer according to Comparative Example 1.

FIGS. 13 to 15 show obtained profiles in the depth direction. Profiles of oxygen, zirconium, and the like are omitted for convenience of illustration. In FIGS. 13 to 15, a horizontal axis represents time (s: second) for which etching is advanced in the depth direction, and can be regarded as a distance in the −Z direction from the upper surface of the piezoelectric layer. A vertical axis represents a detected intensity (unit: cps) of each element. FIGS. 16 and 17 show diffusion states of titanium estimated based on SIMS analysis for Example 1 and Comparative Example 1. In FIGS. 16 and 17, configurations other than the insulator layer 362 (zirconium oxide), the lower electrode 441 (Pt), and the piezoelectric layer 443 (KNN) are not shown.

In FIGS. 13 to 15, a boundary where a distance from the seed layer in the +Z direction, which is a lamination direction, is 240 nm is indicated by a broken line B. That is, in each drawing, a region on a left side of the broken line B is a region where the distance is 240 nm or more. A titanium intensity at the broken line B is indicated by a cross mark.

The broken line B was identified based on the number of peaks of titanium and sodium. Specifically, when the piezoelectric layer is repeatedly laminated by MOD, in each single layer, a sodium intensity gradually decreases from a peak toward the +Z direction from the seed layer, and conversely, a potassium intensity gradually increases from the minimum to the peak. Therefore, in each single layer of the piezoelectric layer, a peak position of sodium, namely a valley position of potassium, is an interface on the side closer to the seed layer, and a valley position of sodium, namely a peak position of potassium, is an interface in the +Z direction. Since each single layer has a thickness of approximately 80 nm, the interface in the +Z direction of a third layer of the piezoelectric layer upward from the seed layer is indicated by the broken line B. A method for identifying the boundary indicated by the broken line B is not limited to the above, and the boundary may be identified by, for example, cross-sectional element analysis or distance measurement in a piezoelectric layer manufactured using a gas phase method or the like.

As shown in FIG. 13, in Example 1, a rightmost peak position of sodium is an interface between the piezoelectric layer 443 and the seed layer 442, and the piezoelectric layer 443 is located on a left side of the interface. In Example 1, diffusion of titanium into the piezoelectric layer 443 is slight. Specifically, the titanium intensity at the broken line B is 70 cps, and the titanium intensity is 300 cps or less in the region where the distance from the seed layer 442 in the lamination direction is 240 nm or more, that is, in the region on the left side of the broken line B. FIG. 16 schematically shows the above results.

As shown in FIG. 16, the KNN piezoelectric layer 443 is formed by laminating layers 443-1, 443-2, 443-3 . . . 443-10 at the time of manufacturing. In the piezoelectric layer 443, diffusion of titanium hardly occurs in the third layer 443-3 or higher, which is a third layer from the lower electrode 441. Therefore, the piezoelectric layer 443 is preferentially oriented to the (100) plane, and the occurrence of cracks is prevented.

As shown in FIG. 14, in Comparative Example 1, a rightmost peak position of sodium is also an interface between the piezoelectric layer and the seed layer, and the piezoelectric layer is located on a left side of the interface. In Comparative Example 1, diffusion of titanium into the piezoelectric layer is more significant than in Example 1. Specifically, the titanium intensity at the broken line B is 3000 cps, and the titanium intensity exceeds 300 cps in the region on the left side of the broken line B. FIG. 17 schematically shows the above results.

As shown in FIG. 17, a KNN layer that is the piezoelectric layer is formed by laminating layers KNN-1, KNN-2 . . . KNN-10 at the time of manufacturing. In the KNN layer, diffusion of titanium also reaches the layer KNN-10, which is a tenth layer from the Pt layer. Accordingly, the KNN layer is not preferentially oriented to the (100) plane, and a region Q oriented to the (111) plane is generated. Therefore, a crack CR is likely to occur along a crystal grain boundary.

As shown in FIG. 15, in Comparative Example 2, a rightmost peak position of sodium is also an interface between the piezoelectric layer and the seed layer, and the piezoelectric layer is located on a left side of the interface. In Comparative Example 2, diffusion of titanium into the piezoelectric layer is greater than that in Example 1, but slighter than that in Comparative Example 1. Specifically, the titanium intensity at the broken line B is 300 cps, and the titanium intensity in the region on the left side of the broken line B is 300 cps or less. Titanium detected in the piezoelectric layer is derived from titanium contained in the seed layer. In Comparative Example 2, although the diffusion of titanium is slight, cracks may occur due to absence of the adhesion layer.

Although not shown, the piezoelectric layer according to Comparative Example 3 was analyzed by SIMS in the same manner as described above, and as a result, the titanium intensity exceeded 200 cps in the region where the distance from the seed layer in the lamination direction was 240 nm or more. Therefore, the piezoelectric layer according to Comparative Example 3 is not preferentially oriented to the (100) plane, and cracks are likely to occur along the crystal grain boundaries.

3. Second Embodiment

In the above embodiment, the lower electrode 441 is formed in a solid state so as to cover the insulator layer 362, and the upper electrodes 444 overlap the pressure chambers C respectively in the direction along the Z axis. However, in the second embodiment, lower electrodes 441*a* may overlap the pressure chambers C respectively in the direction along the Z axis, and an upper electrode 444*a* may be formed in a solid state so as to cover the insulator layer 362.

Figure 18:
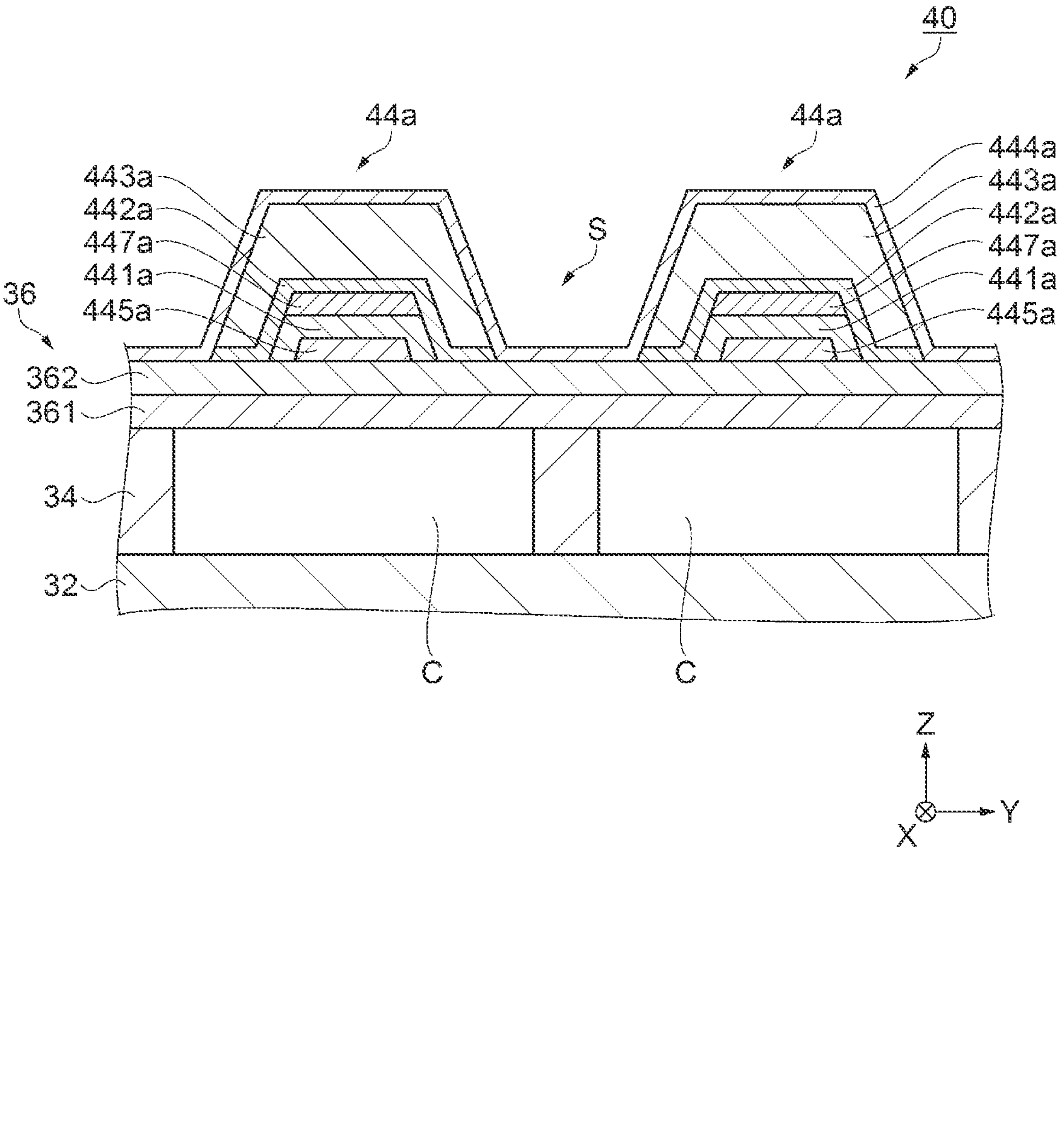
FIG. 18 is a cross-sectional view showing a configuration of a droplet ejection head according to a second embodiment.

A detailed configuration of a piezoelectric element 44*a* will be described. Description of the same points as in the first embodiment will be omitted. As shown in FIG. 18, a plurality of piezoelectric elements 44*a* are formed in contact with an upper surface of the vibration plate 36. The region S is formed between two piezoelectric elements 44 adjacent to each other in the direction along the Y axis. In addition to the two piezoelectric elements 44*a*, FIG. 18 also show the vibration plate 36, the flow path formation substrate 32, and the pressure chamber substrate 34.

The piezoelectric element 44*a* includes an adhesion layer 445*a*, the lower electrode 441*a*, a diffusion reduction layer 447*a*, a seed layer 442*a*, a piezoelectric layer 443*a*, and the upper electrode 444*a*. In the piezoelectric element 44*a*, the adhesion layer 445*a*, the lower electrode 441*a*, the diffusion reduction layer 447*a*, the seed layer 442*a*, the piezoelectric layer 443*a*, and the upper electrode 444*a* are laminated upward in this order. That is, a lamination direction of layers of the piezoelectric element 44*a* is the direction along the Z axis.

A region where the adhesion layer 445*a*, the lower electrode 441*a*, the seed layer 442, the diffusion reduction layer 447*a*, the piezoelectric layer 443*a*, and the upper electrode 444*a* overlap in the plan view is referred to as an active portion 440*a*. The active portion 440*a* is a region where the piezoelectric layer 443*a* is deformed when a voltage is applied between the lower electrode 441*a* and the upper electrode 444*a*. The active portion 440*a* faces the pressure chamber C in the direction along the Z axis, with the vibration plate 36 interposed therebetween.

The adhesion layer 445*a* overlaps each of the pressure chambers C in the direction along the Z axis. The adhesion layer 445*a* is in contact with an upper side of the vibration plate 36, specifically, an upper surface of the insulator layer 362.

The lower electrode 441*a* is formed to cover an upper side and both lateral sides of the adhesion layer 445*a* and a part of an upper side of the insulator layer 362 on both lateral sides of the adhesion layer 445*a*. The lower electrode 441*a* extends from a substantially rectangular region overlapping the pressure chamber C in the +X direction. Although not shown, each lower electrode 441*a* is individually electrically coupled to the drive circuit 50 described above at a point where the lower electrode 441*a* extends in the +X direction.

The diffusion reduction layer 447*a* is formed in contact with an upper surface of the lower electrode 441*a*.

The seed layer 442*a* is formed to cover an upper side of the diffusion reduction layer 447*a*, both lateral sides of the lower electrode 441*a*, and a part of an upper side of the vibration plate 36 on both lateral sides of the lower electrode 441*a*. The seed layer 442*a* controls a crystal orientation of a composite oxide in the piezoelectric layer 443*a* in alignment. The seed layer 442*a* promotes a preferential orientation of a crystal of the piezoelectric layer 443*a* to the (100) plane.

On both lateral sides of the adhesion layer 445*a*, the lower electrode 441*a* is interposed between the adhesion layer 445*a*, and the seed layer 442*a* and the piezoelectric layer 443*a*. Therefore, diffusion of titanium is also reduced at an interface between the piezoelectric layer 443*a* and the adhesion layer 445*a*, and the vibration plate 36.

When a lower electrode of a piezoelectric element is individually disposed, in a configuration in which the lower electrode does not cover lateral sides of an adhesion layer, only a seed layer is interposed between the lateral sides of the adhesion layer and a piezoelectric layer. Therefore, in the piezoelectric layer 443*a*, crystal grains oriented in an unintended plane may grow. In contrast, since the lower electrode 441*a* of the piezoelectric element 44*a* according to the second embodiment covers lateral sides of the adhesion layer 445*a*, diffusion of titanium in the adhesion layer 445*a* into the piezoelectric layer 443*a* is reduced. Accordingly, cracks are less likely to occur even when the piezoelectric layer 443*a* is formed to be relatively thick. Therefore, it is possible to provide a piezoelectric element 44*a* that prevents occurrence of cracks in the piezoelectric layer 443*a*.

4. Third Embodiment

In the above embodiment, the droplet ejection head 1 and the recording apparatus 100 applied with the piezoelectric element 44 are exemplified, but application of the piezoelectric element according to the present disclosure is not limited thereto. The piezoelectric element according to the present disclosure can be applied to an ultrasonic sensor, a piezoelectric motor, an ultrasonic motor, a piezoelectric transformer, a vibratory dust removing apparatus, a pressure-electric converter, an ultrasonic transmitter, a pressure sensor, an acceleration sensor, and the like.

The piezoelectric element according to the present disclosure may be mounted on a power generation apparatus. Examples of the power generation apparatus include a power generation apparatus using a pressure-electric conversion effect, a power generation apparatus using electron excitation by light, a power generation apparatus using electron excitation by heat, and a power generation apparatus using vibration.

Further, the piezoelectric element according to the present disclosure may be applied to a pyroelectric device such as an infrared detector, a terahertz detector, a temperature sensor, or a thermal sensor, or a ferroelectric element such as a ferroelectric memory.

What is claimed is:

1. A piezoelectric element comprising:

an adhesion layer formed at a substrate and containing titanium;

a lower electrode formed at the adhesion layer;

a diffusion reduction layer formed at the lower electrode and containing iridium;

a seed layer formed at the diffusion reduction layer and containing bismuth;

a piezoelectric layer formed at the seed layer and containing potassium, sodium, and niobium; and an upper electrode formed at the piezoelectric layer.

2. The piezoelectric element according to claim 1, wherein the seed layer contains iron, titanium, and lead in addition to bismuth.

3. The piezoelectric element according to claim 2, wherein a thickness of the seed layer is 20 nm or less.

4. The piezoelectric element according to claim 1, wherein the diffusion reduction layer contains iridium oxide.

5. The piezoelectric element according to claim 1, wherein the lower electrode includes a platinum layer.

6. The piezoelectric element according to claim 1, wherein the diffusion reduction layer is formed on the platinum layer of the lower electrode.

7. The piezoelectric element according to claim 1, wherein a thickness of the diffusion reduction layer is 3 nm to 50 nm.

* * * * *